(12) United States Patent
Sumi et al.

(10) Patent No.: US 7,658,289 B2
(45) Date of Patent: Feb. 9, 2010

(54) SUBSTRATE STORAGE CONTAINER

(75) Inventors: Atsushi Sumi, Niigata (JP); Junya Toda, Niigata (JP); Takayuki Nakayama, Niigata (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 2 days.

(21) Appl. No.: 12/021,719

(22) Filed: Jan. 29, 2008

(65) Prior Publication Data
US 2008/0149527 A1   Jun. 26, 2008

Related U.S. Application Data

(62) Division of application No. 10/496,932, filed as application No. PCT/JP03/012612 on Oct. 1, 2003, now Pat. No. 7,455,180.

(30) Foreign Application Priority Data

Oct. 25, 2002  (JP) ............................. 2002-311275
Nov. 28, 2002  (JP) ............................. 2002-344954

(51) Int. Cl.
*B65D 51/16*  (2006.01)
*B65D 85/30*  (2006.01)
*H01L 21/02*  (2006.01)

(52) U.S. Cl. ..................... 206/710; 206/711; 137/508

(58) Field of Classification Search ............... 206/710, 206/711, 832, 833, 454, 449; 220/367.1, 220/368, 371; 137/508, 511, 315.22
See application file for complete search history.

(56) References Cited

U.S. PATENT DOCUMENTS 3,845,876 A * 11/1974 Needham et al. ....... 220/203.29
4,909,276 A    3/1990 Bayly et al.
5,649,639 A    7/1997 Dolvet et al.
5,810,062 A    9/1998 Bonora et al.
5,879,458 A    3/1999 Roberson, Jr. et al.
5,971,203 A   10/1999 Bae
6,044,874 A    4/2000 Saga
6,056,026 A    5/2000 Fosnight et al.
6,187,182 B1   2/2001 Reynolds et al.
6,199,604 B1   3/2001 Miyajima (Continued)

FOREIGN PATENT DOCUMENTS

EP    1 075 023 A1    2/2001

(Continued)

*Primary Examiner*—Mickey Yu
*Assistant Examiner*—Steven A. Reynolds
(74) *Attorney, Agent, or Firm*—Darby & Darby P.C.

(57) ABSTRACT

A substrate storage container includes a container body for accommodating and aligning semiconductor wafers, a door which opens and closes the front of the container body and a pair of valve units disposed at the bottom of the container body for controlling gas flow. Each valve unit includes a fixed sleeve for gas flow, fitted in a rib of a through-hole of the container body, a holding sleeve fitted in the through-hole of the container body with an o-ring interposed therebetween and mated and threaded with the fixed sleeve, a check valve built between the fixed sleeve and the holding sleeve, leaving a clearance, an elastically deformable element for opening and closing the check valve, an interior lid sleeve for gas flow, opposing the check valve and supporting the elastically deformable element, and a filter interposed between the holding sleeve and the interior lid sleeve.

12 Claims, 15 Drawing Sheets

U.S. PATENT DOCUMENTS 6,319,297 B1 11/2001 Fosnight
6,732,877 B2 5/2004 Wu et al.

FOREIGN PATENT DOCUMENTS

| | | | |
|---|---|---|---|
| JP | 62-193537 | A1 | 12/1987 |
| JP | 5-34371 | A1 | 5/1993 |
| JP | 6-6843 | A1 | 1/1994 |
| JP | 09-280399 | A1 | 10/1997 |
| JP | 11-150178 | A1 | 6/1999 |
| JP | 2000-315724 | A1 | 11/2000 |
| WO | 99/50577 | A1 | 10/1999 |

* cited by examiner

SUBSTRATE STORAGE CONTAINER

CROSS-REFERENCE TO PRIOR APPLICATIONS

This is a divisional application of U.S. patent application Ser. No. 10/496,932, filed May 25, 2004, now U.S. Pat. No. 7,455,180 which is the U.S. national phase application under 35 U.S.C. §371 of International Patent Application No. PCT/JP2003/012612, filed Oct. 1, 2003, and claims the benefit of Japanese Patent Application No. 2002-311275, filed Oct. 25, 2002, and Japanese Patent Application No. 2002-344954, filed Nov. 28, 2002, all of which are incorporated by reference herein. U.S. patent application Ser. No. 10/496,932 issued as U.S. Pat. No. 7,455,180 on Nov. 25, 2008. International Application No. PCT/JP2003/012612 was published in Japanese on May 6, 2004 as WO 2004/038789 A1 under PCT Article 21(2).

TECHNICAL FIELD

The present invention relates to a gas-purgeable, substrate storage container for storing substrates such as semiconductor wafers, photomask glass, and detailedly relates to a valve unit for gas purging, for controlling the gas flow, both into and from, the substrate storage container.

BACKGROUND ART

In the recent semiconductor industry, as seen in the case of DRAM (Dynamic Random Access Memory) production, while there has been competition for acquisition of marketshare due to cost reduction of semiconductor devices, revision of the production system, for cost reduction, as well as development of semiconductor wafers used for production of semiconductor devices into large sizes (300 mm or greater) have been in progress.

As to the revision of the production system, there is an example where the system in which the whole semiconductor manufacturing plant is kept as a highly clean environment (e.g. class 10 clean or above) to manufacture semiconductor devices is transferred to the system in which multiples processing steps of semiconductor wafers are divided into sections, each interior space being maintained to be highly clean while semiconductor wafers are conveyed by substrate storage containers between the processing steps.

According to such a new system, the installation cost for clean room construction as well as the running cost for its maintenance can be sharply cut down, and yet with increased production yield in the semiconductor device manufacturing.

The standards of the substrate storage containers used in the semiconductor production plant using this new system are specified by SEMI standards (E19, E47.1, E62, E63 and others), so that the container has a conveyance device for automated in-plant transportation and a door in compliance with FIMS, which can be attached and removed by automation. Further, the substrate storage container is demanded to have high hermetic sealing property for avoiding contamination of the semiconductor wafers and also, in order to keep the interior of the container body clean it should be formed using clean material that emits a lower amount of volatile gases.

The minimum conductor width of electronic circuits formed on semiconductor devices tends to be smaller and smaller (0.01 μm or below). In order to facilitate this, it is necessary to prevent the surfaces of the semiconductor wafers held in the substrate storage container from being formed with a natural oxide film and being contaminated with organic matter. As a countermeasure against this, there is a method called the gas purge (replacement) technique, which drives out the interior of the substrate storage container with an inert gas such as nitrogen or dry air with moisture removed (equal to or below 1%).

With regard to this, some techniques have been proposed: a filter is attached by providing a partial opening in the substrate storage container; or valves such as check valves, etc., are provided at the periphery of the opening so as to achieve gas purging (see Japanese Patent Application Laid-open Hei 11 No. 191587 and Japanese Patent Application Disclosure 2002-510150).

The conventional substrate storage containers, which are constructed and gas purged as above, suffer from the following problems.

First, in the case where gas purge is performed with a valve attached to the substrate storage container, an engagement structure for valve attachment is needed. However, this engagement structure increases the complexity of the arrangement. An ordinary valve has a hollow portion with a narrow opening, and a shutoff valve that closes this opening is provided to come into contact with a tapered portion of the opening, creating a sealing structure. This shutoff valve is readily displaced by repeated usage, resultantly presenting a leakage problem due to imperfect seal. Further, since the ordinary valve incorporates more than a few metallic parts such as a spring for valve control and the like, there is a fear that a very small quantity of metal ions, discharged from the metal parts while the substrate storage container is put in storage or during its cleaning, infiltrates into the substrate storage container, contaminating semiconductor wafers.

On the other hand, in the case where a filter is merely attached to the substrate storage container, gas purge can be done with a simple configuration. In this case, however, there is a problem in that the purging gas charged through the filter, however, cannot be kept inside the substrate storage container. Therefore, the gas in the substrate storage container can easily leak out, so that the gas purge effect can be maintained in only a short period. There is also a problem in that it is impossible to effectively prevent a trace amount of organic matter in the clean room from flowing into the interior of the substrate storage container from exterior because there is a passage between inside and outside of the substrate storage container.

DISCLOSURE OF INVENTION

In view of the above, it is an object of the present invention to provide a substrate storage container in which the engagement structure for valve attachment can be simplified, which can prevent displacement of the valve due to repeated usage and hence prevent incomplete sealing and which is free from the risk of traces of discharged metal ions contaminating the substrates. It is also another object to enable relatively long-term holding of purging gas and to efficiently prevent inflow of contaminant from the outside to the inside of the container.

In order to attain the above objects, the present invention according to claim 1 is a configuration including: a container body; a door for opening and closing the container body; a valve unit attached to a through-hole formed in, at least, one of the container body and the door, for regulating the gas flow with respect to the container body, and is characterized in that the valve unit comprises: a fixed sleeve for gas flow, fitted in the through-hole; a holding sleeve for gas flow, mated with the fixed sleeve; an elastic check valve built in between the fixed sleeve and the holding sleeve; and an interior lid sleeve for gas flow, opposing the elastic check valve, and one of the fixed sleeve and the interior lid sleeve is adapted to be opened and closed by the elastic check valve, so that gas will pass through when the elastic check valve is open while gas will be prevented from passing when the elastic check valve is closed.

It is preferred that a through-hole is formed in the bottom of the container body, and the valve unit as a gas inlet valve or gas discharge valve is fitted to the through-hole.

Further, it is possible that a rib is formed and extended outward from the periphery of the through-hole and the fixed sleeve is formed with a flange that is in contact with the periphery of the rib while the holding sleeve is formed with a flange that is in contact with the periphery of the through-hole.

It is also preferred that a clearance for gas flow is formed at least between the holding sleeve and the periphery of the elastic check valve.

It is also preferred that the interior lid sleeve is fitted in the holding sleeve with an air filter interposed therebetween.

Further, it is possible that the elastic check valve is at least made up of a check valve that is built in the fixed sleeve, leaving a clearance, and an elastically deformable element interposed between the check valve and the interior lid sleeve, and the opening of the fixed sleeve is adapted to be opened and closed by the check valve, so that gas will pass through when the check valve is open while gas will be prevented from passing when the check valve is closed.

It is also possible that the elastic check valve is at least made up of a check valve that is built in the fixed sleeve, leaving a clearance, and an elastically deformable element interposed between the check valve and the fixed sleeve, and the opening of the interior lid sleeve is adapted to be opened and closed by the check valve, so that gas will pass through when the check valve is open while gas will be prevented from passing when the check valve is closed.

It is also possible that the elastic check valve is at least made up of a check valve that is built in the fixed sleeve, leaving a clearance, and an elastically deformable element for the check valve, and either the check valve or the elastically deformable element is made in contact with the interior lid sleeve, so that gas will pass through when the check valve is open while gas will be prevented from passing when the check valve is closed.

It is possible that a guide element is provided for either the check valve of the elastic check valve or the interior lid sleeve while a guided part is provided for the other, so that the guide element and the guided part fit to each other in a slidably manner.

It is further possible that the guide element is formed in the interior lid sleeve so as to have an approximately convex-top section while the guided part is formed in the check valve of the elastic check valve so as to have an approximately concave-top section.

It is also possible that a sealing element is attached to the check valve of the elastic check valve, and the sealing element is placed into deforming contact with the opening of the fixed sleeve or the interior lid sleeve to seal.

It is possible that a through-hole is formed in the bottom of the container body, and a hollow nozzle tower communicating with the valve unit is made to stand, the peripheral wall thereof being formed with gas ejection holes.

It is also possible that a through-hole is formed in the bottom of the container body, and a deflecting plate is attached in the vicinity of the hole, the deflection plate being formed having an approximately L-shaped section with its longer part opposed to the valve unit with a gap therebetween.

Further, it is possible that the elastic check valve is at least made up of a check valve that is built in the fixed sleeve, leaving a clearance and an extensible bellows fitted in the check valve, the peripheral wall of the bellows is formed with a passage opening, and the check valve can be opened and closed by the extension and compression of the bellows.

Moreover, it is possible that the elastic check valve is at least made up of a check valve that is built in the fixed sleeve, leaving a clearance and an elastic skirt body integrated with the check valve, a passage opening is formed in the check valve, an approximately cylindrical skirt piece is flexibly extended from the rim of the skirt body and is fitted on the periphery of the check valve, and the check valve can be opened and closed by the deformation of the skirt body.

Here, the container bodies within the range of the claims are mainly of a front-open box type. However, a top-open, bottom-open or side-open type may be used. Also, whether it is transparent or opaque is not particularly limited. This container body accommodates a single or a multiple number of substrates or the like such as semiconductor wafers, photomask glass, etc. The gas is usually inert gas or dry air, but is not particularly limited.

Also, the valve units may be attached to the through-holes in both the container body and the door, or may be the through-holes in either the container body or the door. One or plural valve units may be used. The elastic check valve can be formed of a single part or made up of separate parts, i.e., a check valve and an elastically deformable element. A single or multiple sealing elements may be attached to the check valve, so that the sealing element(s) is placed into deforming contact with the fixed sleeve or the interior lid sleeve. The elastically deformable element may be built in the holding sleeve, leaving a clearance therebetween, but not necessary so. Further, the interior lid sleeve may be supported by the holding sleeve by an engaging means made up of concave and convex shapes.

BEST MODE FOR CARRYING OUT THE INVENTION

The preferred embodiment of the present invention will be described hereinbelow with reference to the drawings. The substrate storage container of the present embodiment is comprised of, as shown in FIGS. 1 to 7, a container body 1 for accommodating and aligning a plurality of semiconductor wafers W in horizontal layers along the vertical direction, a door 10 which is removably attached to the front opening of the container body 1 to open and close it, and a pair of valve units 20 disposed in the bottom of container body 1 for controlling gas flow with respect to container body 1. Of the pair of valve units 20, one valve unit 20 is used as a gas inlet valve 20A, the other valve unit 20 as a gas discharge valve 20B.

As the semiconductor wafers W, 25 or 26 pieces of 300 mm silicon wafers, for example, may be accommodated therein.

Figure 1:
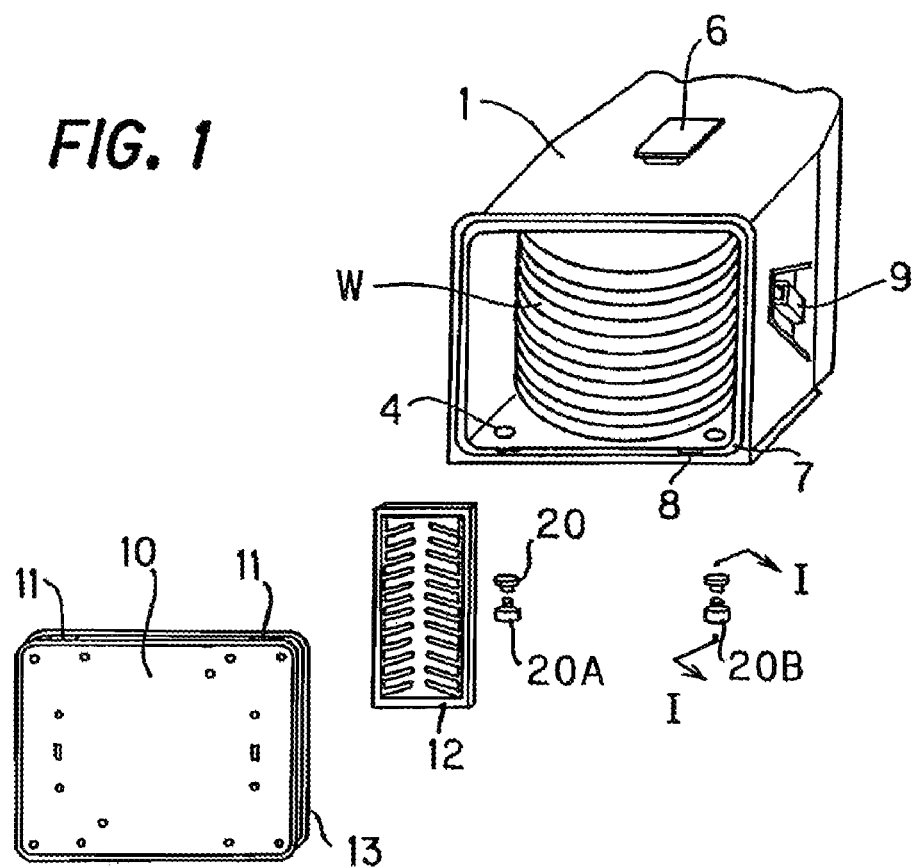
FIG. 1 is a perspective exploded view showing the embodiment of a substrate storage container according to the present invention.
Figure 2:
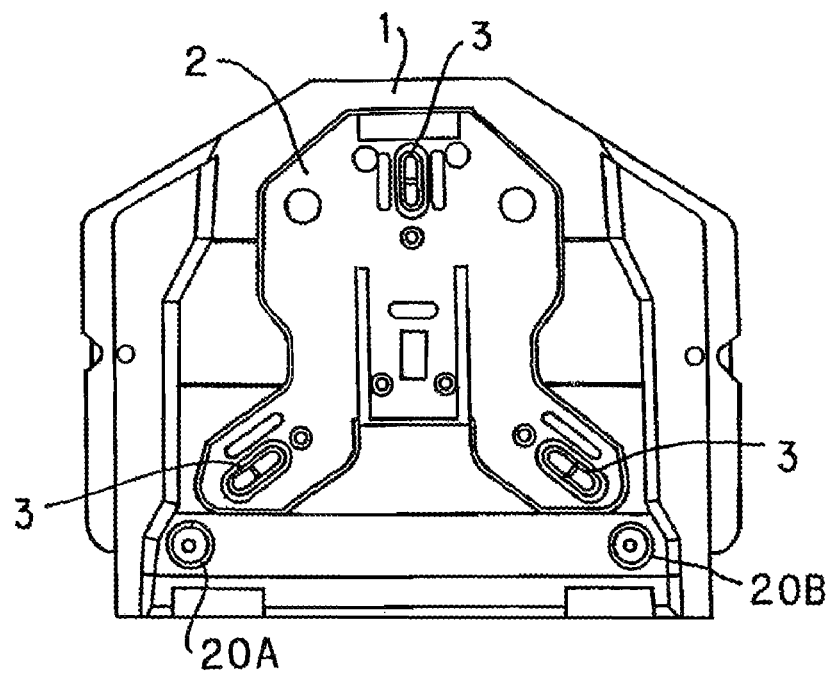
FIG. 2 is a bottom view showing a container body in the embodiment of a substrate storage container according to the present invention.

As shown in FIG. 1, container body 1 is formed as a front-open box type, having an opening on one side or on the front, using polycarbonate or the like, added with carbon fibers, conductive polymers or the like so as to present conductivity. Provided on both the interior sides are supporting structures (not shown) for supporting the rims of semiconductor wafers W at both sides by supporting pieces. As shown in FIG. 2 an approximately Y-shaped, in plan view, bottom plate 2 having through-holes for detection and discrimination of the substrate storage container type is removably attached to the bottom of this container body 1. This bottom plate 2 has positioning members 3 having an approximately V-shaped section and arranged at both sides in front and one in the rear for positioning with respect to processing equipment. Other than these plurality of positioning members 3, bottom plate 2 has through-holes for attachment of an identification maker and clamp holes for fixture to the container body are bored, respectively.

Figure 3:
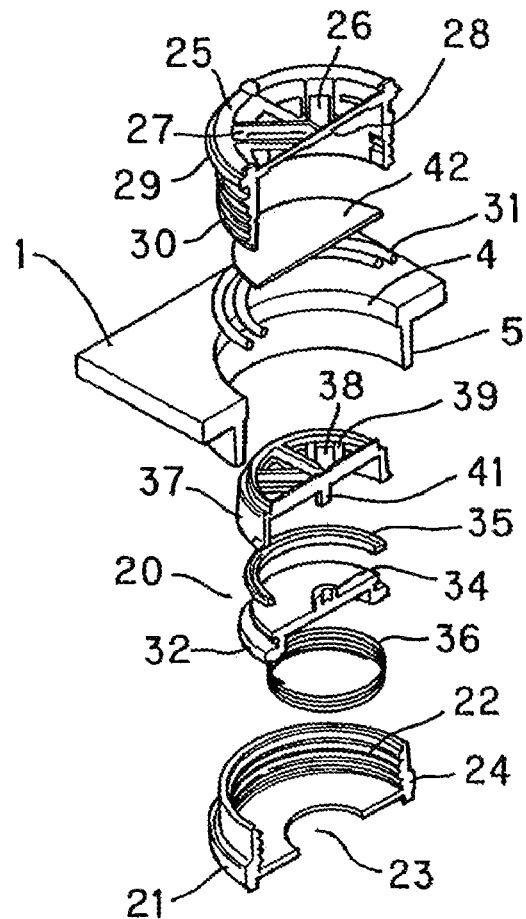
FIG. 3 is a perspective exploded view showing a valve unit, cut along a chain line I-I in FIG. 1, in the embodiment of a substrate storage container according to the present invention.

Formed on both sides on the front part of the bottom of the container body, or in other words, in the area not overlapping the projected area of semiconductor wafers W, are round through-holes 4, respectively, as shown in FIGS. 1 to 3. At the periphery of each through-hole 4, a cylindrical rib 5 externally projected downwards is integrally formed. A handle 6 is removably attached to the top of container body 1. This handle 6 is held by an automaton called OHT (overhead hoisting transfer), whereby the substrate storage container is transferred from one step to another. A wide rim portion 7 for door fitting is integrally formed around the periphery of the front opening of container body 1. Formed in the interior of the rib portion 7 at both the top and bottom are hollow, door engagement slots 8. A pair of carrying handles 9 for manual handling are removably attached externally on both side of container body 1.

Door 10 is formed in a laterally long, approximately rectangular shape with four rounded corners, and incorporates an unillustrated interlocking mechanism. This interlocking mechanism includes a multiple number of retractable engagement prongs, which can project and retract from retraction holes 11 on the peripheral wall, and project and fit into engagement slots 8 of rim portion 7, so that the door 10 fitted to container body 1 will be tightly closed. A stepped portion that fits rim portion 7 of container body 1 is projectively formed on the rear side of door 10. Attached in a removable manner to this stepped portion is a front retainer 12 for supporting and aligning multiple semiconductor wafers W in their horizontal position with a predetermined pitch along the vertical direction. An endless gasket 13 for seal with container body 1 is fitted on the peripheral wall of door 10.

Here, container body 1, bottom plate 2, handle 6, carrier handles 9 and door 10 are formed of thermoplastic resin such as, for example, polycarbonate, polyetherimide, polyetheretherketone, cyclic olefine polymer (COP), or one of these added with conductivity.

As shown in FIG. 3 and others, each valve unit 20 is constructed of a fixed sleeve 21 that is removably attached to rib 5 of through-hole 4 of container body 1 from below and forms the gas flow passage, a holding sleeve 25, removably attached to through-hole 4 of container body 1 from above with an O-ring 31 for seal interposed therebetween and screw fitted with fixed sleeve 21, a check valve 32 built in for defining a clearance 33 between the fixed sleeve 21 and holding sleeve 25, an elastically deformable element 36 for opening and closing this check valve 32, an interior lid sleeve 37 that opposes check valve 32 and holds elastically deformable element 36 and forms the gas flow passage, and a disk-shaped filter 42 interposed between holding sleeve 25 and interior lid sleeve 37. Check valve 32 and elastically deformable element 36 constitute an elastic check valve, which controls gas flow from fixed sleeve 21 to holding sleeve 25.

As shown in FIGS. 3 to 7, fixed sleeve 21 is basically a cylinder with a base, formed using polycarbonate, polyetherimide, polyetheretherketone, or the like, with a threaded groove 22 incised for fastening formed on the inner periphery thereof. This fixed sleeve 21 has a round vent port 23 formed at the bottom center for creating a gas flow passage. An annular flange 24 extending radially outwards is formed around the outer periphery at the bottom. This flange 24 abuts from below against the rim of the opening of rib 5.

Figure 4:
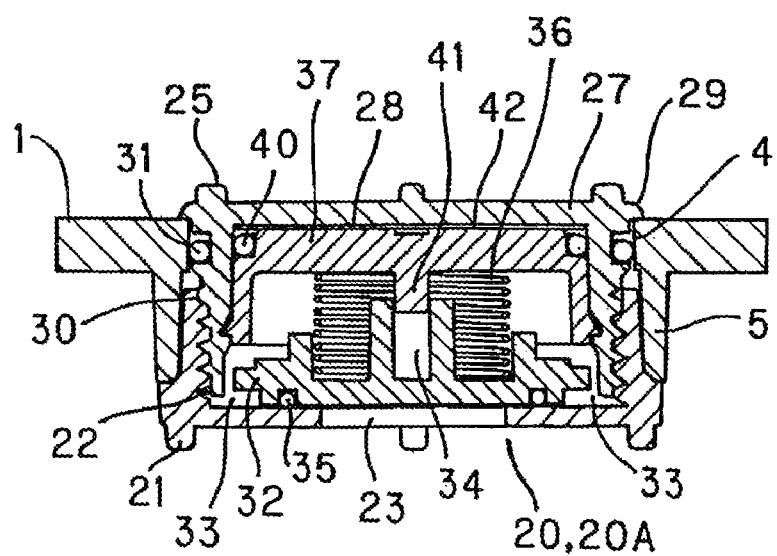
FIG. 4 is a sectional illustrative view showing a gas inlet valve in the embodiment of a substrate storage container according to the present invention.

As shown in FIGS. 3 and 4, holding sleeve 25 is basically formed of the same resin as fixed sleeve 21, for example, in a cylindrical shape that is formed in a size smaller to snugly fit into fixed sleeve 21. In the opening top, sectioning ribs 27 for sectioning the opening into multiple vents 26 for gas flow passage are formed in a lattice-like or radial configuration. The underside of these sectioning ribs 27 serve as an abutment face 28 having a corresponding shape to a filter 42 and receiving it. This holding sleeve 25 has an annular flange 29 that extends radially outwards from the upper peripheral side. This flange 29 comes into contact from above with the rim of through hole 4. A thread 30 for fastening is formed on the outer periphery of holding sleeve 25 so that this thread 30 will mesh with threaded groove 22 of fixed sleeve 21.

O-ring 31 is disposed between through-hole 4 and the outer periphery of holding sleeve 25 to effectively prevent infiltration of gas into container body 1 and gas leakage from container body 1.

Check valve 32, as shown in FIGS. 3 to 7 and others, is formed in a disk-like configuration having an approximately plate-shaped section or an approximately hat-like section, using predetermined material based on the usage of valve unit 20, and is fitted and placed on the interior base of fixed sleeve 21 so as to cover the round vent port 23 and define clearance 33 as gas flow passage in cooperation with the inner periphery of holding sleeve 25. As the material for this check valve 32, polyethylene, polypropylene, polycarbonate, cyclic polyolefin polymer, thermoplastic polyester elastomer can be referred to, for example. A guided part 34 having an approximate concave-top section for preventing displacement is projectively formed from the center of the check valve 32 surface while an endless sealing element 35 is fitted along the periphery on the undersurface. This sealing element 35 provides the function of a sealing contact, by deformation, with the inner base of fixed sleeve 21.

Figure 6:
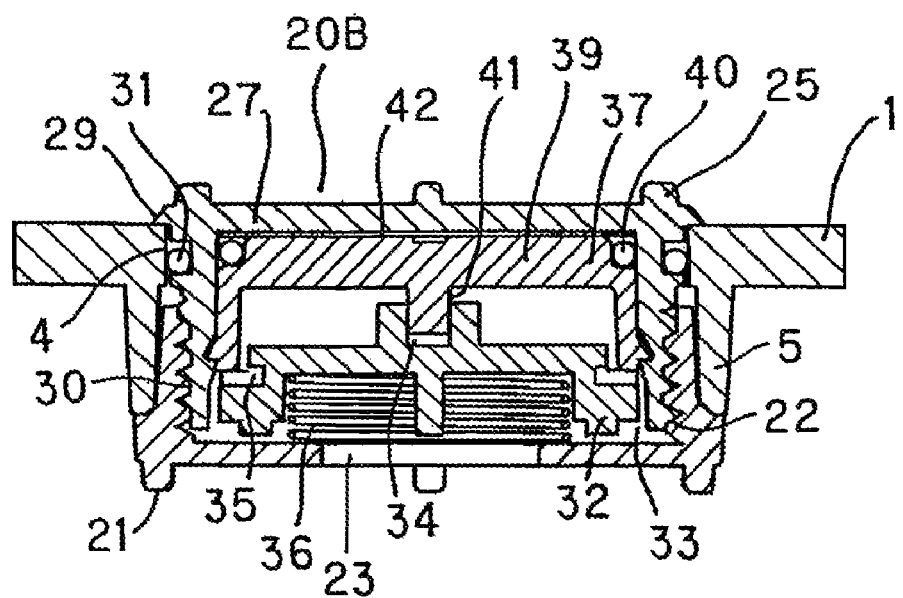
FIG. 6 is a sectional illustrative view showing a gas discharge valve in the embodiment of a substrate storage container according to the present invention.
Figure 7:
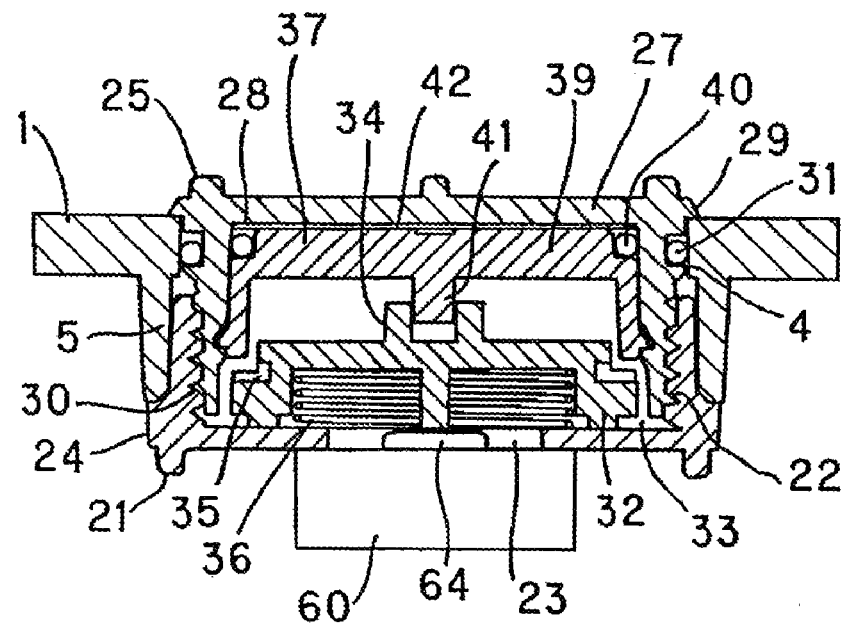
FIG. 7 is a sectional illustrative view showing the gas discharge valve, shown in FIG. 6, from which gas is discharged.
Figure 8:
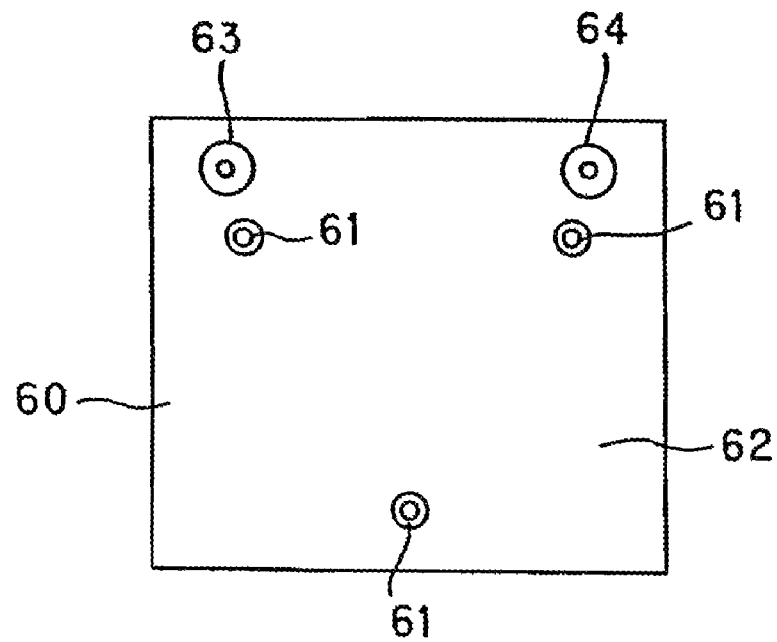
FIG. 8 is an illustrative plan view showing a jig for gas purge in the embodiment of a substrate storage container according to the present invention.
Figure 9:
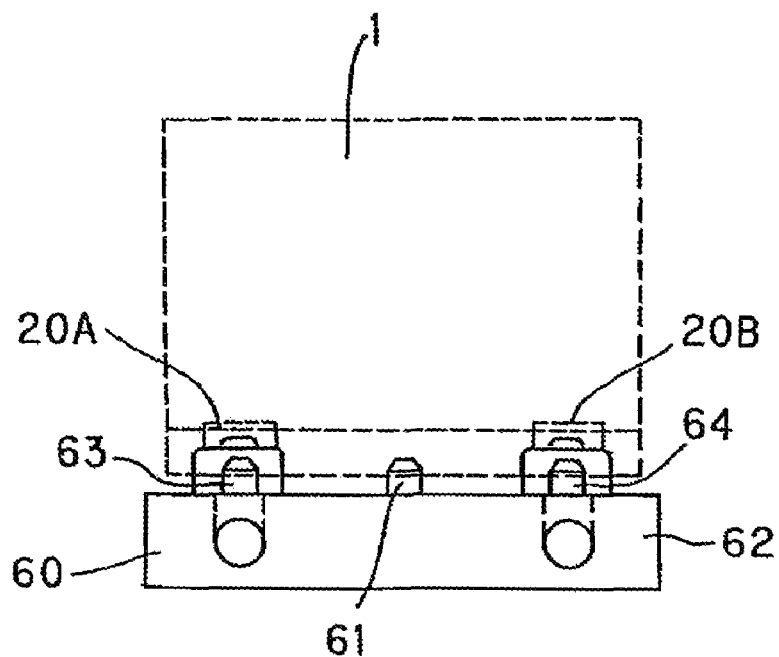
FIG. 9 is a side view showing the jig for gas purge in FIG. 8 in its usage state.

Sealing element 35 is an O-ring, for example, or an elastic ring formed of fluoro rubber, NBR rubber, urethane rubber, EPDM rubber, silicone rubber or the like, coated with fluorine or silicone on the surface thereof, as appropriate. When formed with metal, the surface is coated with resin. When valve unit 20 is used as a gas discharge valve 20B instead of its usage as a gas inlet valve 20A as shown in FIGS. 4 and 5, this sealing element 35 is fitted to the stepped periphery on the surface side of check valve 32 and pressed against the opening rim of interior lid sleeve 37, as shown in FIGS. 6 and 7.

When valve unit 20 is used as a gas inlet valve 20A, the thus constructed check valve 32 covers vent port 23 of fixed sleeve 21 by the elastically repulsive action of elastically deformable element 36, as shown in FIG. 4. On the other hand, when valve unit 20 is used as a gas discharge valve 20B, the check valve and elastically deformable element 36 are arranged upside down, and is placed on and supported by elastically deformable element 36 and pressed against the opening rim of interior lid sleeve 37 (see FIGS. 6 and 7).

Elastically deformable element 36 is comprised of a coil spring formed of SUS, synthetic resin or the like, and is disposed between guided part 34 of check valve 32 and interior lid sleeve 37 or between the inside of check valve 32 and fixed sleeve 21. This elastically deformable element 36, in most cases, employs a coil spring shown in the drawings, but is not limited to this. Elastic rubbers, elastomers, foamed materials, leaf springs and the like can also be used. Further, coil springs with their surface coated with a synthetic resin or elastomer can be used. In this case, discharge of a trivial amount of metal ions can be preferably prevented.

Figure 5:
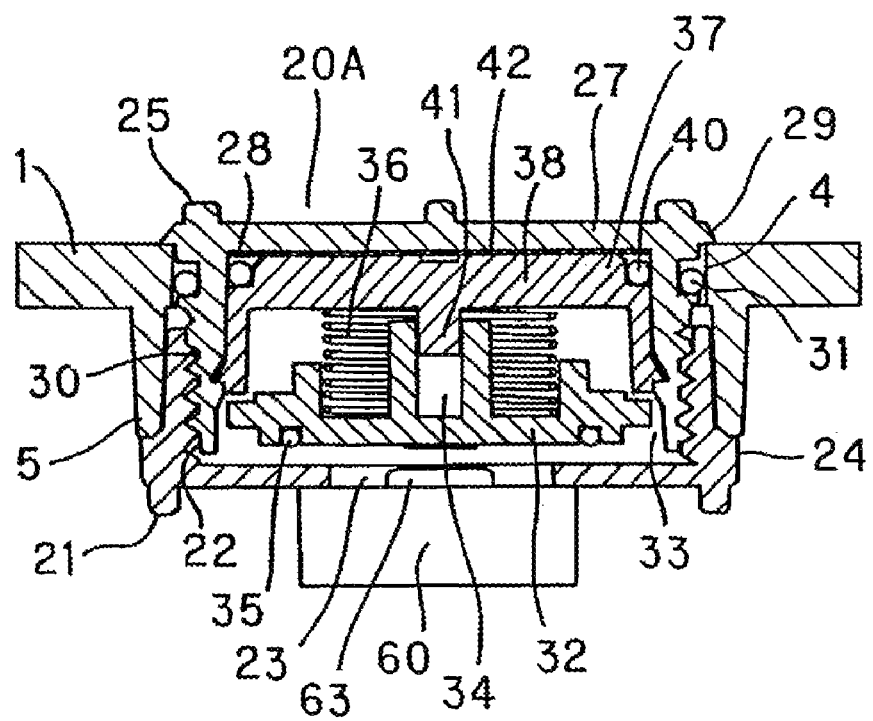
FIG. 5 is a sectional illustrative view showing the gas inlet valve, shown in FIG. 4, to which gas is supplied.

When valve unit 20 is used as a gas inlet valve 20A, the elastically deformable element 36 is fitted to the recessed surface side of check valve 32 as seen in FIGS. 3 to 5. When valve unit 20 is used as a gas discharge valve 20B, the elastically deformable element is arranged upside down with respect to check valve 32 and placed at the periphery of vent port 23 of fixed sleeve 21 (see FIGS. 6 and 7).

Interior lid sleeve 37 is basically formed in a cylindrical shape, as shown in FIGS. 3 to 7, of the same material as fixed sleeve 21, with sectioning ribs 39 for sectioning its top opening into multiple vents 38 for gas flow passage in a lattice-like or radial configuration, and is held in holding sleeve 25 and placed in contact with elastically deformable element 36. This interior lid sleeve 37 is fitted and supported by means of a concavo-convex mating structure into holding sleeve 25 while an O-ring 40 for sealing is disposed between the interior lid sleeve and the upper interior part of holding sleeve 25. A guide element 41 having an approximate convex-top section for assembly convenience and limiting displacement is projectively formed from the center of the undersurface of sectioning ribs 39 of interior lid sleeve 37. This guide element 41 slidably mates into guided element 34. One example of the concavo-convex mating structure can be constructed such that a slot formed on the inner periphery of holding sleeve 25 or on the outer periphery of interior lid sleeve 37 may be engaged with a projection to fit into the slot, formed on the outer periphery of interior lid sleeve 37 or on the inner periphery of holding sleeve 25.

When valve unit 20 is used as a gas inlet valve 20A, this interior lid sleeve 37 is in contact with elastically deformable element 36, while, when valve unit 20 is used as a gas discharge valve 20B, this interior lid sleeve 37 is in contact with elastically deformable element 36, its open bottom is pressed against the peripheral part of check valve 32 with sealing element 35 in between (see FIGS. 6 and 7).

Filter 42 is composed of a molecular filter consisting of tetrafluoroethylene, polyester fiber, porous Teflon (registered trademark) film and glass fiber and/or a chemical filter in which chemical adsorbents are deposited on filter media such as activated carbon fiber and the like. A single or multiple number of filters are interposed and held between abutment face 28 of holding sleeve 25 and sectioning ribs 39 of interior lid sleeve 37 so as to cover the vents 38 of interior lid sleeve 37. A protective member made of polypropylene, polyethylene or the like is laminated as appropriate over the front and rear sides of filter 42.

When a multiple number of filters 42 are employed, the same type of filters may be used or different types of filters may be used. For example, if a molecular filter and a chemical filter are used in combination, organic gas contamination in addition to particle contamination of wafers W can be prevented.

Though assembly of valve unit 20 may be done by thread joint, another joint may be used alone or in combination with thread joint. For example, a recessed portion may be formed in one of fixed sleeve 21 and holding sleeve 25 while a projected portion may be formed in the other, so that these recess and projection can mate each other to complete fixture. It is also possible to form a recessed portion in one of holding sleeve 25 and interior lid sleeve 37 and a projected portion in the other, so that these recess and projection can be mated to each other to complete fixture.

Gas purge of the substrate storage container having the thus configured valve units 20 is carried out during being docked to the door opening/closing machine (load port or door opener), during storage at the stocker, during engagement in the process and/or during conveyance on the way to the stocker. For this purpose, if the machine side is equipped with a gas purge jig 60 and the substrate storage container is set to the gas purge jig 60, smooth, efficient and easy performance of gas purging can be expected.

Gas purge jig 60 may be configured of, as shown in FIGS. 5 and 7 to 9, for example, a housing body 62 having substrate storage container positioning pins 61 laid out in an approximate Y-arrangement, an air feed nozzle 63 disposed in the housing body 62 and connected to one valve unit 20, an air discharge nozzle 64 disposed in housing body 62 and connected to another valve unit 20, an air feed path built in housing 62 for connection between air feed nozzle 63 and a gas feed source and an air discharge path built in housing 62 for connection between air discharge nozzle 64 and a discharge device.

For air feed nozzle 63 and air discharge nozzle 64, seal forming means for prevention against gas leakage is formed appropriately around their projected portions. For example, air feed nozzle 63 is configured so that it projects from the contact surface of housing body 62 so as to be connected to valve unit 20 when it is used and it sinks in to housing body 62 so as to flatten the contact surface of housing body 62 when it is not used.

In the above configuration, when the valve unit 20 is used as a gas inlet valve 20A and no gas such as an inert gas or the like is fed from the outside into the substrate storage container interior, check valve 32 of gas inlet valve 20A is pressed against the interior bottom face of fixed sleeve 21 via sealing element 35 by the repulsive force of elastically deformable element 36 so as to close vent port 23, completing a sealed state (see FIG. 4).

In contrast, when a gas such as an inert gas etc., is fed from air feed nozzle 63 of gas purge jig 60 to gas inlet valve 20A, the pressure of the gas ejected from air feed nozzle 63 urges check valve 32 of gas inlet valve 20A toward interior lid sleeve 37, compressing elastically deformable element 36 in the same direction, whereby check valve 32 forms a gap with respect to vent port 23 of fixed sleeve 21, releasing the sealed state (see FIG. 5). This cancellation of the sealed state causes gas to flow from the substrate storage container exterior, passing through the clearance 33 between vent port 23 of fixed sleeve 21 and check valve 32, the gap, interior lid sleeve 37 and filter 42, in the order mentioned, into the interior of the substrate storage container.

On the other hand, when the valve unit 20 is used as a gas discharge valve 20B, elastically deformable element 36 of gas discharge valve 20B presses check valve 32 over sealing element 35 and toward and against the opening rim of interior lid sleeve 37, forming a sealed state.

In contrast, when the substrate storage container interior is filled up with a gas, the pressure of the filling gas presses check valve 32 of gas discharge valve 20B toward fixed sleeve 21, expanding elastically deformable element 36 in the same direction, forming clearance 33 between check valve 32 and interior lid sleeve 37 to cancel the sealed state. This cancellation of the sealed state causes gas to flow out from the substrate storage container interior, passing through filter 42, interior lid sleeve 37, the clearance between check valve 32 and interior lid sleeve 37, the gap and vent port 23 of fixed sleeve 21, in the order mentioned, to the outside of the substrate storage container. In this case, gas purge can be efficiently done if air discharge nozzle 64 of gas purge jig 60 is connected to gas discharge valve 20B so as to reduce the pressure.

According to the above configuration, it is possible to create a firm engagement structure which is free of possible dislodgment by abutting flanges 24 and 29 of fixed sleeve 21 and holding sleeve 25 mating each other, against throughhole 4 and rib 5 of container body 1. Therefore, the configuration of the engagement structure can be made simple, and still the metallic mold for container body 1 can be simplified. Further, since guided part 34 and guide element 41 mate each other, providing the function of controlling positional displacement, check valve 32 can operate stably never causing positional displacement even with repeated use. Accordingly, it is possible to provide an efficient solution to the problem whereby leakage occurs due to imperfect sealing hence beneficial gas purge can be expected. Further, since valve unit 20 does not need to incorporate a number of metallic parts, it is possible to inhibit a trace amount of metal ions from being released from such a metal part when the substrate storage container is kept in storage or washed, and it is also possible to expect simplification and cost reduction of valve unit 20.

Moreover, fitting of a sealing element 35 to check valve 32 at the peripheral part of the front or rear surface, as appropriate so that it will be pressed in the perpendicular direction, makes it possible for valve unit 20 to be effectively used as a gas inlet valve 20A or as a gas discharge valve 20B. As a result, it is possible to lengthen the retention duration of the replaced gas in the interior of the substrate storage container, hence maintain the gas purge effect for a long period. Also, since the clearance 33 between holding sleeve 25 and the periphery of check valve 32 can be made wide open, efficient gas purge can be greatly expected. Further, since valve unit 20 incorporating filter 42 is attached to the substrate storage container, the filter 42 is not only effective in gas purging but also in retaining the purging gas in the substrate storage container interior. Accordingly, the gas will not readily flow outside from the substrate storage container, hence it is possible to maintain the gas purge effect for a prolonged period of time. Moreover, since provision of valve units 20 allow for indirect communication between the interior and exterior of the substrate storage container, it is possible to almost perfectly prevent the organic matter that trivially exists in the clean room from infiltrating into the inside from the outside of the substrate storage container.

Figure 10:
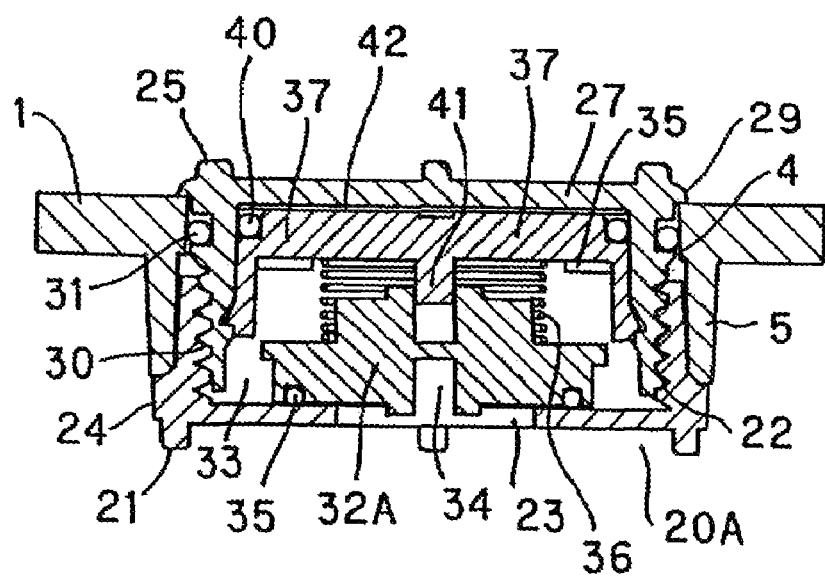
FIG. 10 is a sectional illustrative view showing a gas inlet valve in the second embodiment of a substrate storage container according to the present invention.
Figure 11:
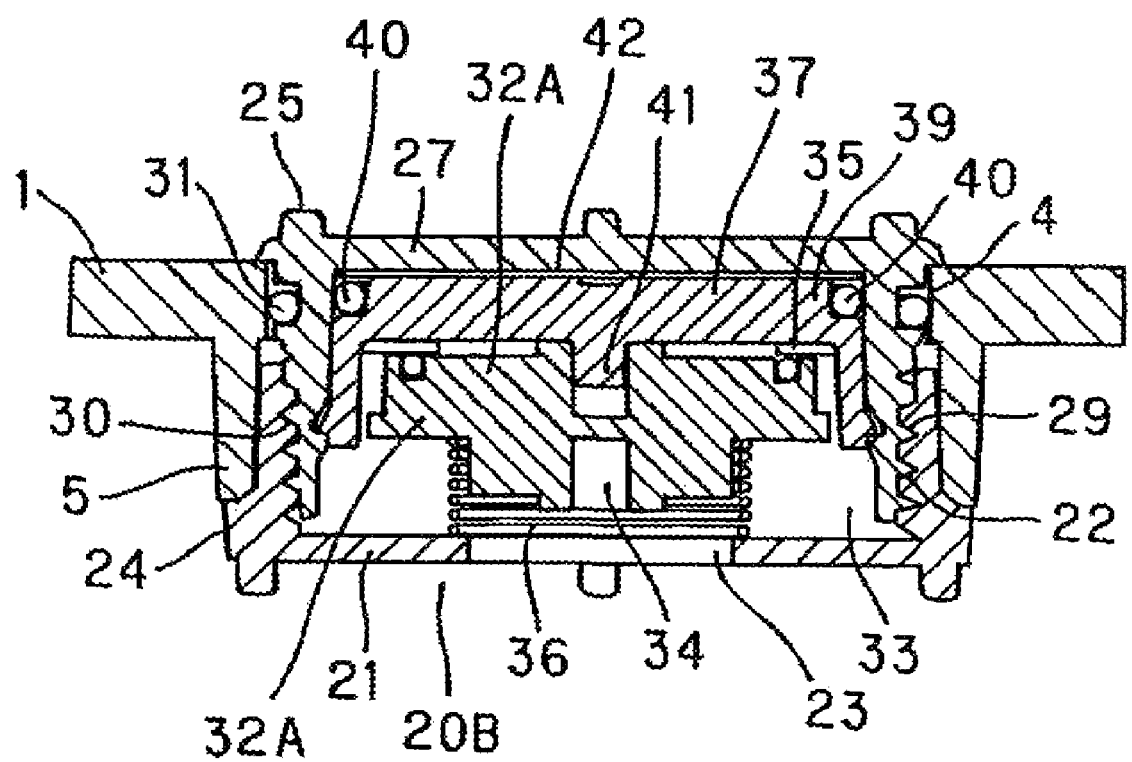
FIG. 11 is a sectional illustrative view showing a gas discharge valve in the second embodiment of a substrate storage container according to the present invention.
Figure 12:
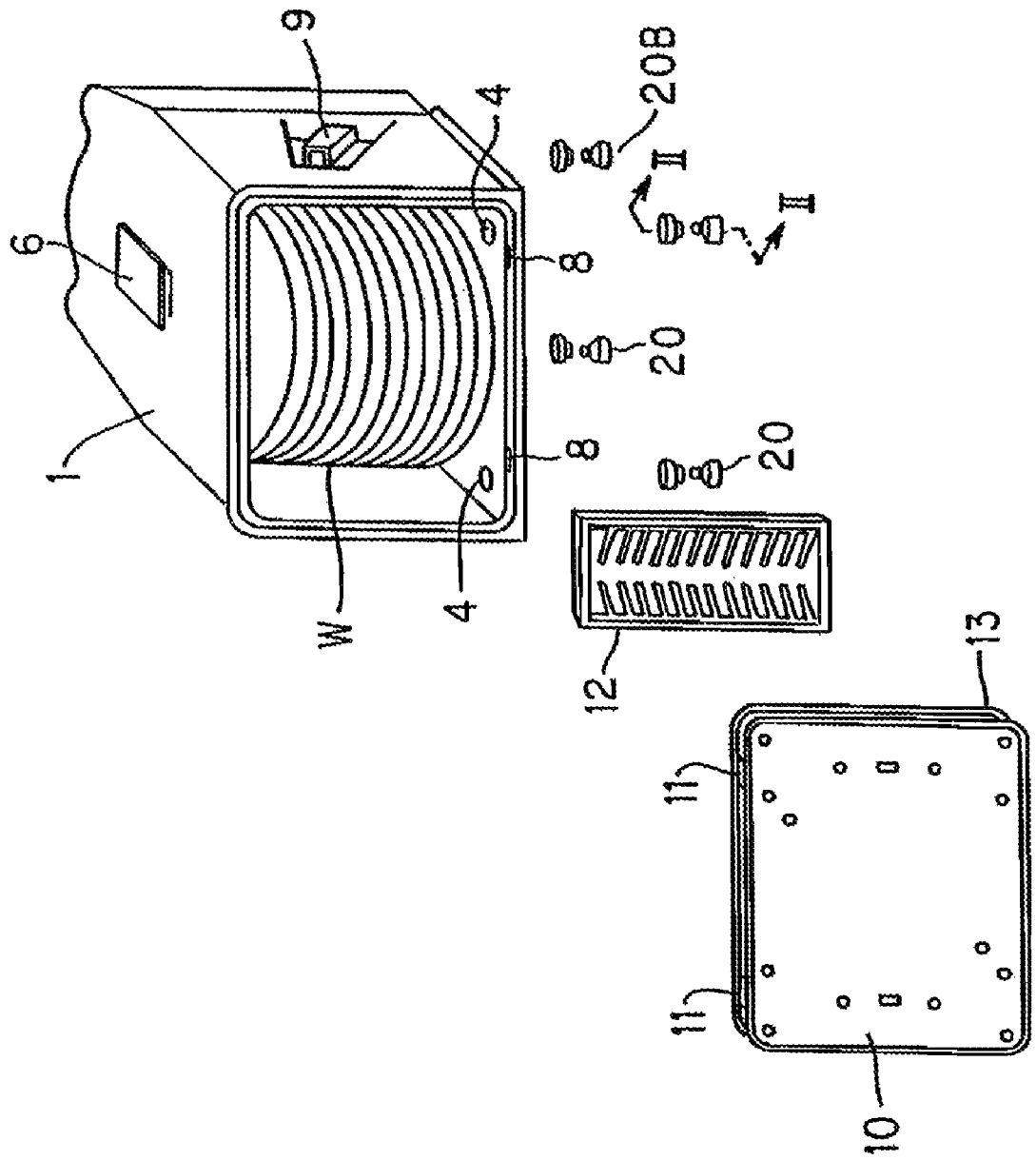
FIG. 12 is a perspective exploded view showing the third embodiment of a substrate storage container according to the present invention.

Next, FIGS. 10 and 11 show the second embodiment of the present invention. In this case, a check valve 32A is constructed so as to be used both in a gas inlet valve 20A and in a gas discharge valve 20B.

Check valve 32A basically is a solid form having an approximately convex-top section, with a pair of round holes for guided parts 34, formed at the center thereof in both the front and rear sides. An annular sealing element 35 is fitted along the periphery of the underside. The check valve is formed marginally smaller than the inside diameter of an interior lid sleeve 37. A pair of guided parts 34, not being connected to each other, have a partition therebetween. When the valve is used as a gas inlet valve 20A, this check valve 32A is set with its projected portion up, as shown in FIG. 10. When the valve is used as a gas discharge valve 20B, the check valve is set upside down as shown in FIG. 11.

Interior lid sleeve 37 basically has a configuration similar to that of the above embodiment, however, an annular sealing element 35 that will be in contact with the periphery of check valve 32A or sealing element 35, is additionally bonded to the interior ceiling of the interior lid sleeve. Other components are the same as in the above embodiment so that description is omitted.

Also in this embodiment, the same operation and effect as that in the above embodiment can be expected. In addition, since common parts can be used, it is no longer necessary to provide plural types of check valves 32A depending on the usage of valve units 20. Accordingly, it is evidently expected that assembly work and management can be greatly made efficient.

Here, a grooved hole may be formed along the periphery on each of both the front and rear sides of check valve 32A so that a sealing element 35 is selectively fitted into these paired grooved holes.

Next, FIGS. 12 to 18 show the third embodiment of the present invention. In this case, each valve unit 20 is constructed of a fixed sleeve 21 that is removably attached to rib 5 of a through-hole 4 of a container body 1 from below and forms the gas flow passage, a holding sleeve 25, removably attached to through-hole 4 of container body 1 from above with an O-ring 31 for sealing interposed therebetween and screw fitted with fixed sleeve 21, an elastic check valve 32B built in for defining a clearance 33 between the fixed sleeve 21 and the holding sleeve 25, an elastically deformable element 36A having air permeability and continuous porosity, deforming the check valve 32B, an interior lid sleeve 37 that is in contact with elastically deformable element 36A and forms the gas flow passage and a disk-shaped filter 42 interposed between holding sleeve 25 and interior lid sleeve 37 while no guided part 34 and guide element 41 is provided. Each valve unit 20 is used for plural gas inlet valves 20A and gas discharge valves 20B.

Figure 13:
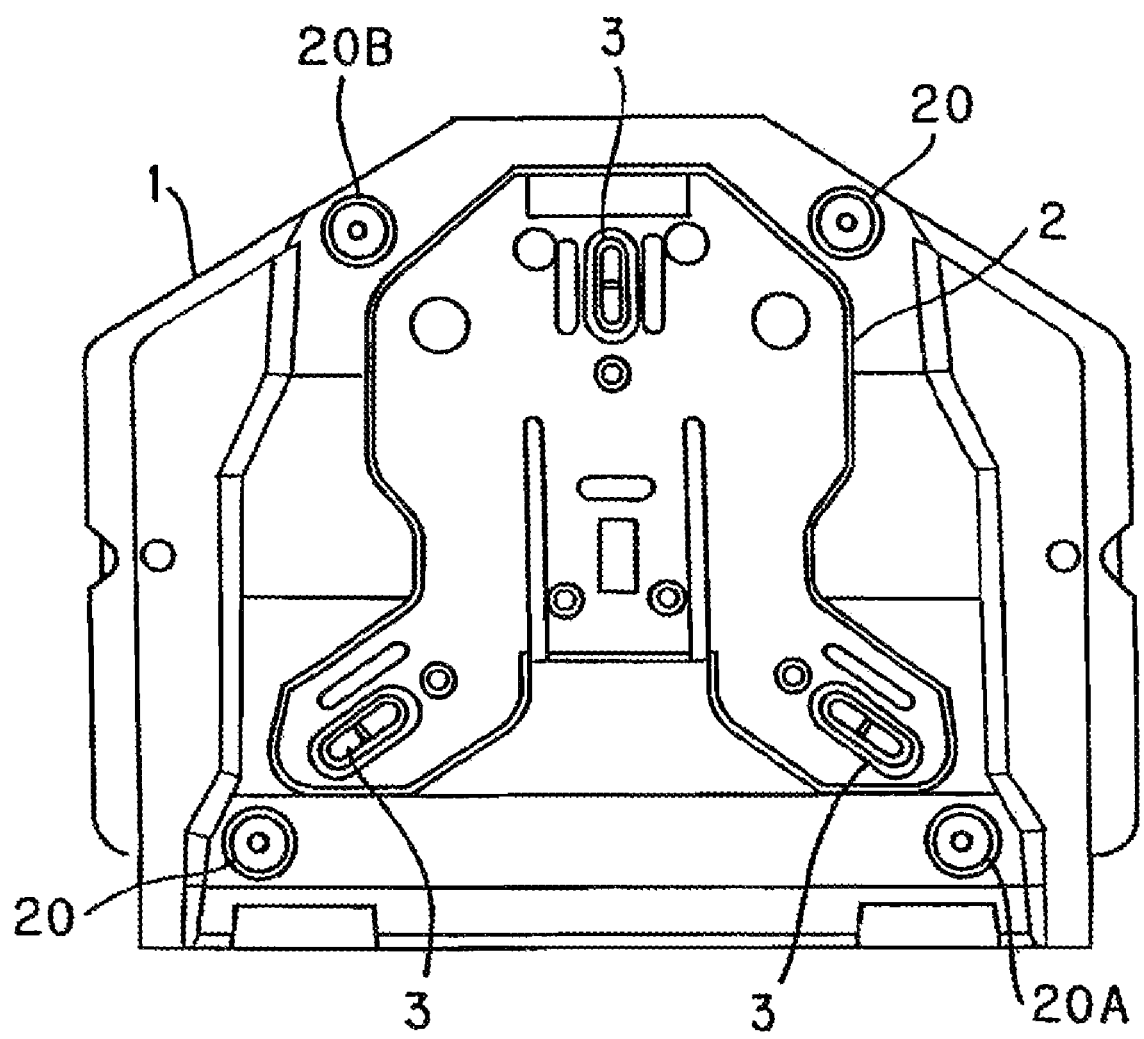
FIG. 13 is a bottom view showing a container body in the third embodiment of a substrate storage container according to the present invention.

Formed on both sides on the front and rear parts of the bottom of container body 1, or in other words, in the area not overlapping the projected area of semiconductor wafers W, are round through-holes 4, respectively, as shown in FIG. 13. At the periphery of each through-hole 4, a cylindrical rib 5 externally projected downwards is integrally formed. Fixed sleeve 21, holding sleeve 25 and filter 42 in each valve unit 20 are the same as those in the above embodiment, so that description is omitted.

Figure 14:
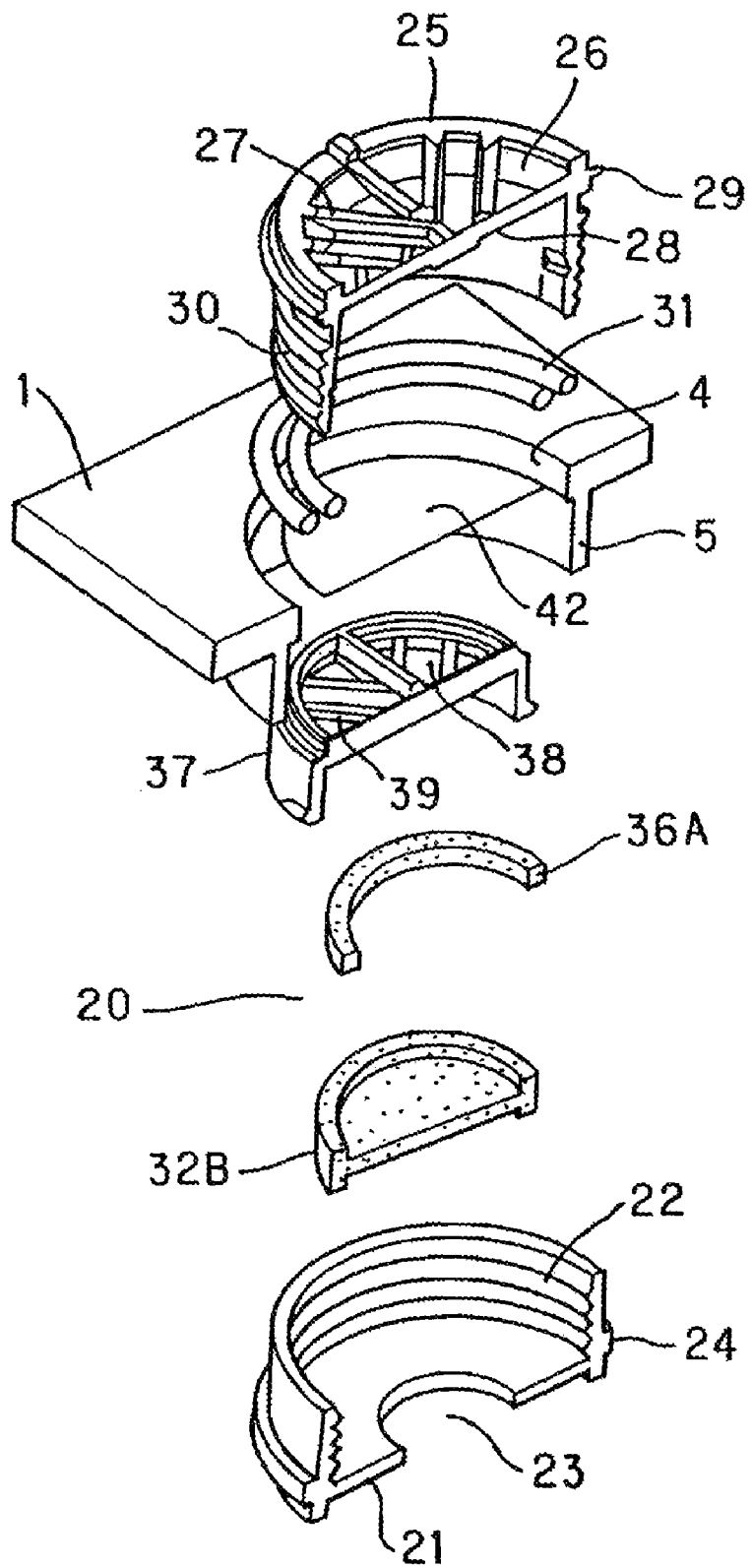
FIG. 14 is a perspective exploded view showing a valve unit, cut along a chain line II-II in FIG. 12, in the third embodiment of a substrate storage container according to the present invention.

As shown in FIG. 14, check valve 32B is formed of a predetermined elastomer, in an approximately disk-shape, in plan view, having an approximately H-shaped section and is fitted and mounted in the interior base of fixed sleeve 21 so as to cover a round vent port 23 and form a small clearance 33 for gas flow passage between itself and the inner peripheral surface of holding sleeve 25. For the material of this flexible check valve 32B, rubbers including melamine rubber, isoprene rubber, butyl rubber, silicone rubber and fluororubber, polyester thermoplastic elastomer and other thermoplastic elastomers can be used. The check valve 32B side that opposes fixed sleeve 21 is appropriately formed with a concavo-convex surface for sealing.

Figure 15:
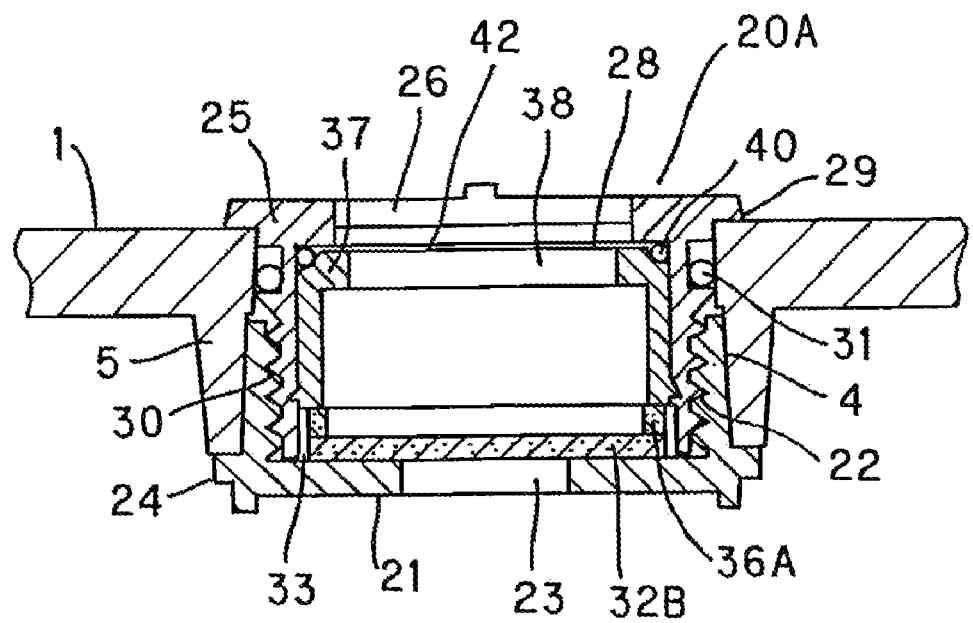
FIG. 15 is a sectional illustrative view showing a gas inlet valve in the third embodiment of a substrate storage container according to the present invention.

When the valve unit 20 is used as gas inlet valve 20A, the check valve 32B covers vent port 23 of fixed sleeve 21 by the repulsive force of elastically deformable element 36A as shown in FIG. 15. On the other hand, when the valve unit 20 is used as a gas discharge valve 20B, the check valve 32B and elastically deformable element 36A are laid upside down so that the check valve rests on elastically deformable element 36A and comes into press contact with the opening periphery of interior lid sleeve 37 (see FIGS. 17 and 18).

As shown in FIG. 14, elastically deformable element 36A is given in the form of a continuous porous ring made of a predetermined foaming material so as to enable communication between the interior and exterior of container body 1, and is fitted to the interior of holding sleeve 25 and rests on the outer periphery of check valve 32B while defining a small clearance 33 for gas flow passage in cooperation with the interior peripheral surface of holding sleeve 25. This endless elastically deformable element 36A is made from, for example, rubbers such as melamine rubber, isoprene rubber, butyl rubber, silicone rubber and fluororubber, polyethylenes, elastic and permeable unwoven cloth and the like. Because check valve 32B is compressed and deformed when operated, the degree of compressive strain is set to be low. The shape of elastically deformable element 36A is not limited to annular forms, but may be given in any other form, for example, in a cylindrical form, etc., as long as it can provide the necessary air permeability.

When valve unit 20 is used as a gas inlet valve 20A, the thus constructed elastically deformable element 36A is set on the periphery of check valve 32B as shown in FIG. 15. On the other hand, when valve unit 20 is used as a gas discharge valve 20B, the check valve 32B and elastically deformable element 36A are laid upside down so that the elastically deformable element is fitted and placed on the inner base surface of fixed sleeve 21 (see FIGS. 17 and 18). Other components are the same as in the above embodiment so that description is omitted.

In the above configuration, when the valve unit 20 is used as a gas inlet valve 20A and no gas such as an inert gas or the like is fed from the outside into the substrate storage container interior, check valve 32B of gas inlet valve 20A is pressed against the interior base face of fixed sleeve 21 via sealing element 35 by the repulsive force of elastically deformable element 36A so as to close vent port 23, completing a sealed state (see FIG. 15).

Figure 16:
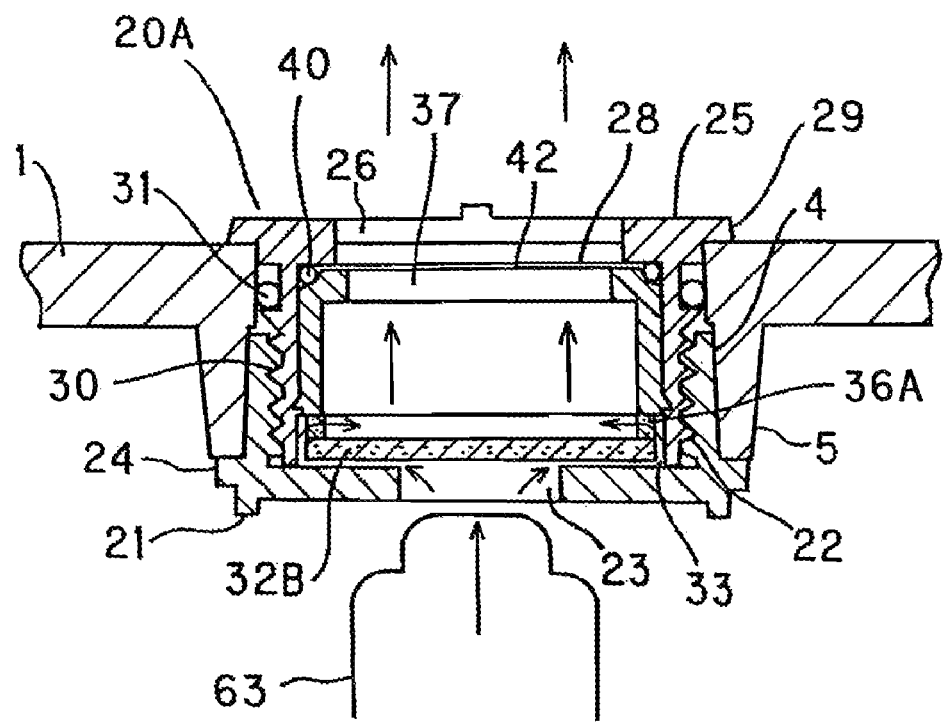
FIG. 16 is a sectional illustrative view showing the gas inlet valve, shown in FIG. 15, to which gas is supplied.

In contrast, when a gas such as an inert gas etc., is fed from an air feed nozzle 63 of a gas purge jig 60 to gas inlet valve 20A as indicated by the arrows in FIG. 16, the pressure of the gas ejected from air feed nozzle 63 urges check valve 32B of gas inlet valve 20A toward interior lid sleeve 37, compressing elastically deformable element 36A in the same direction, whereby the deformed check valve 32B forms clearance 33 with respect to vent port 23 of fixed sleeve 21, releasing the sealed state. This cancellation of the sealed state causes gas to flow from the substrate storage container exterior, passing through the clearance 33 between vent port 23 of fixed sleeve 21 and check valve 32B, the gap, interior lid sleeve 37 and filter 42, in the order mentioned, into the interior of the substrate storage container.

Figure 17:
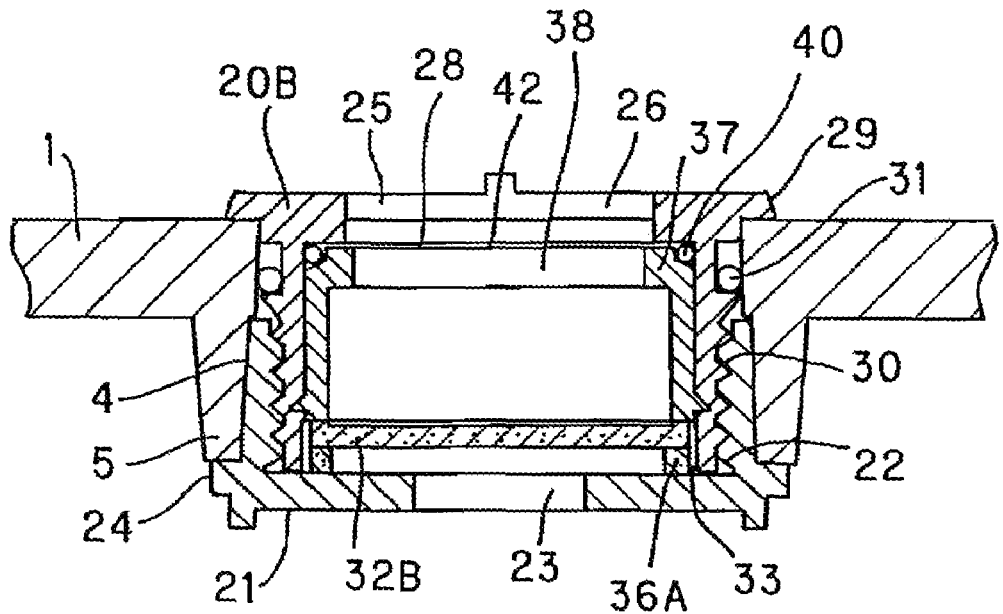
FIG. 17 is a sectional illustrative view showing a gas discharge valve in the third embodiment of a substrate storage container according to the present invention.

On the other hand, when the valve unit 20 is used as a gas discharge valve 20B, elastically deformable element 36A of gas discharge valve 20B presses check valve 32B over sealing element 35 against the opening rim of interior lid sleeve 37, forming a sealed state (see FIG. 17).

Figure 18:
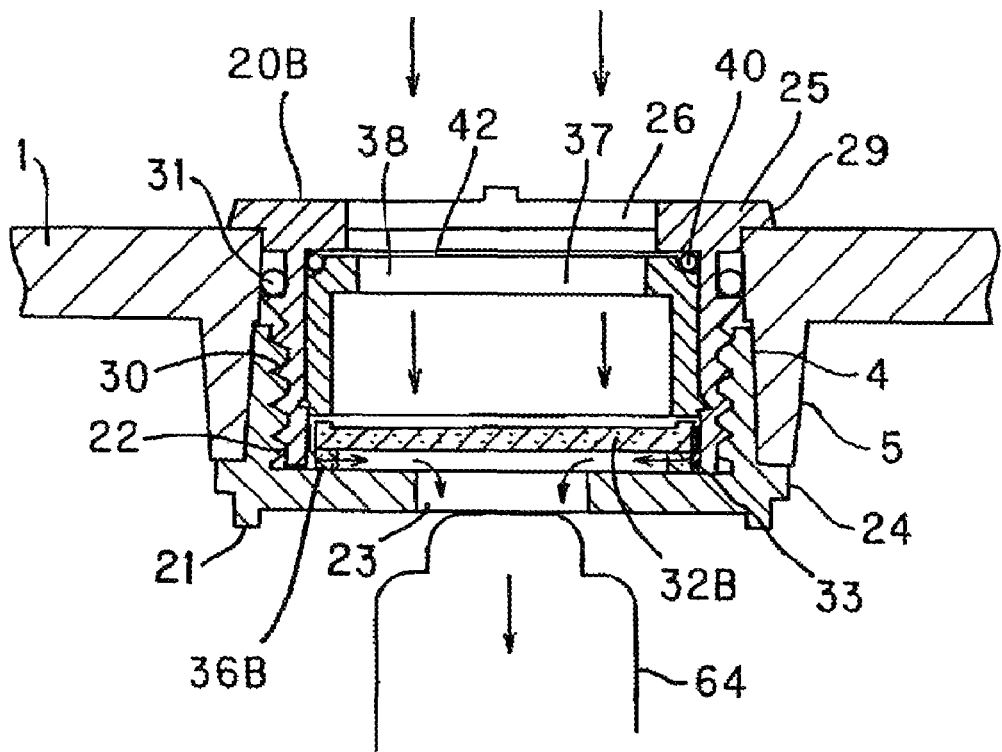
FIG. 18 is a sectional illustrative view showing the gas discharge valve shown in FIG. 17, from which gas flows out to the outside.

In contrast, when the substrate storage container interior is filled up with a gas as indicated by the arrows in FIG. 18, the pressure of the filling gas presses check valve 32B of gas discharge valve 20B toward fixed sleeve 21, compressing elastically deformable element 36A in the same direction, forming clearance 33 between deformed check valve 32B and interior lid sleeve 37 to cancel the sealed state. This cancellation of the sealed state causes gas to flow out from the substrate storage container interior, passing through holding sleeve 25, filter 42, interior lid sleeve 37, the clearance 33 between check valve 32B and interior lid sleeve 37, the gap and vent port 23 of fixed sleeve 21, in the order mentioned, to the outside of the substrate storage container. In this case, gas purge can be efficiently done if air discharge nozzle 64 of gas purge jig 60 is connected to gas discharge valve 20B so as to reduce the pressure.

Also in this embodiment, the same operation and effect as that in the above embodiment can be expected. Besides, since guided part 34 and guide element 41 are omitted, it is obvious that a further simplified configuration can be obtained. Further, since no metal part is used inside valve unit 20, it is possible to avoid any discharge of a trace amount of metalions from metal parts when the substrate storage container is kept in storage or washed.

Figure 19:
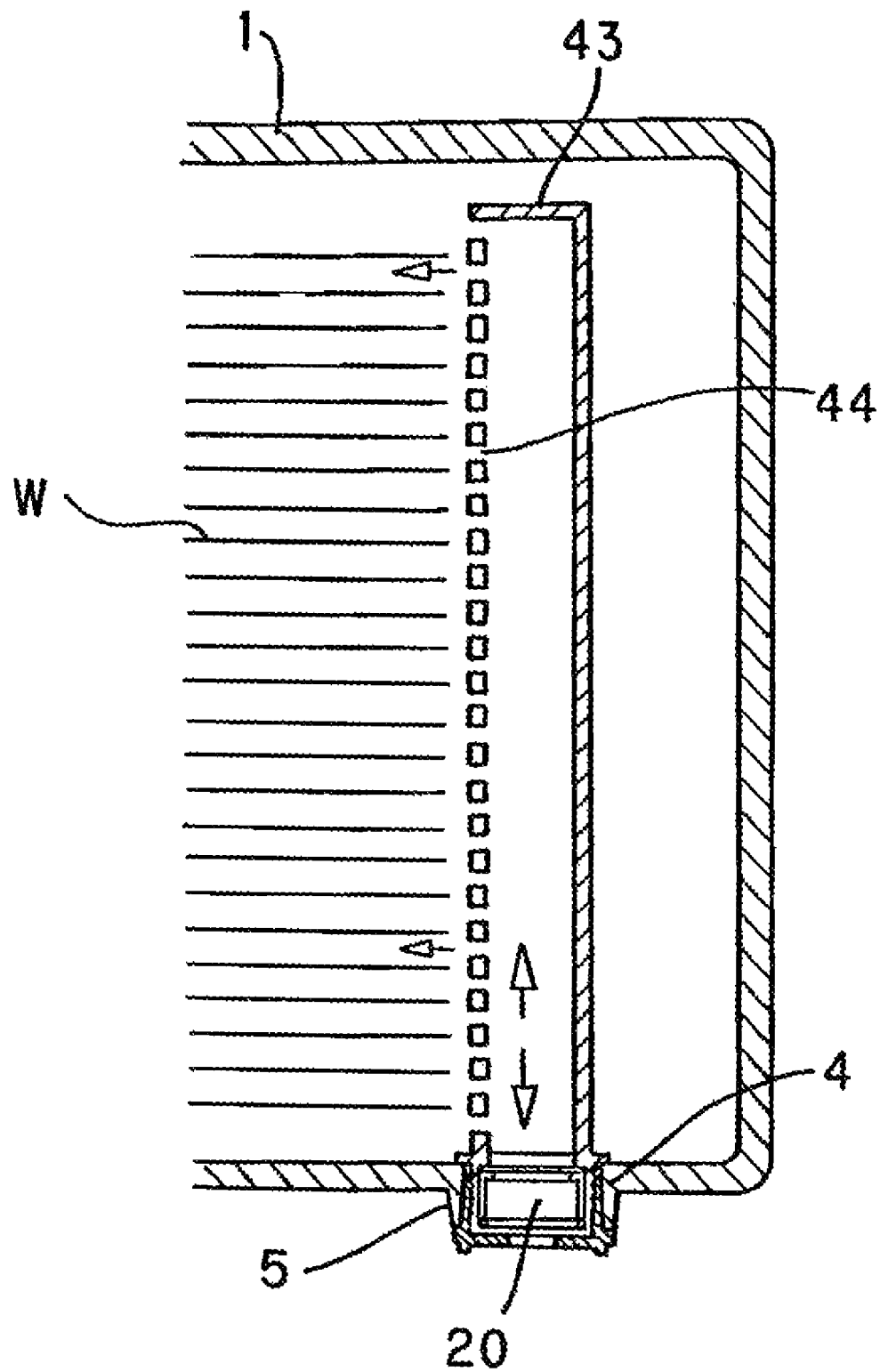
FIG. 19 is a partial sectional illustrative view showing the fourth embodiment of a substrate storage container according to the present invention.

Next, FIG. 19 shows the fourth embodiment of the present invention. In this case, a nozzle tower 43 that is connected to a valve unit 20 is made to stand at some or all of through-holes 4 in a container body 1.

Nozzle tower 43 is basically a hollow cylinder, formed of a predetermined resin such as, for example, polycarbonate, polyetherimide, polyetheretherketone, cycloolefin polymer or the like, and has a row of holes arranged vertically at intervals of a predetermined distance as gas ejection ports 44, on the peripheral wall thereof opposing the side of semiconductor wafers W, whereby gas is fed from these ejection ports 44 toward the semiconductor wafers W. Sectional size of these ejection ports 44 may be all equal in size or may be formed to be gradually greater from the bottom to the top. Other components are the same as that of the above embodiment so the description is omitted.

Also in this embodiment, the same operation and effect as that in the above embodiment can be expected. Besides, since gas is moved from multiple ejection ports 44 towards semiconductor wafers W, it is obvious that stagnation inside the container body 1 can be cancelled during gas feeding, thus making it possible to sharply reduce the time of purging.

Figure 20:
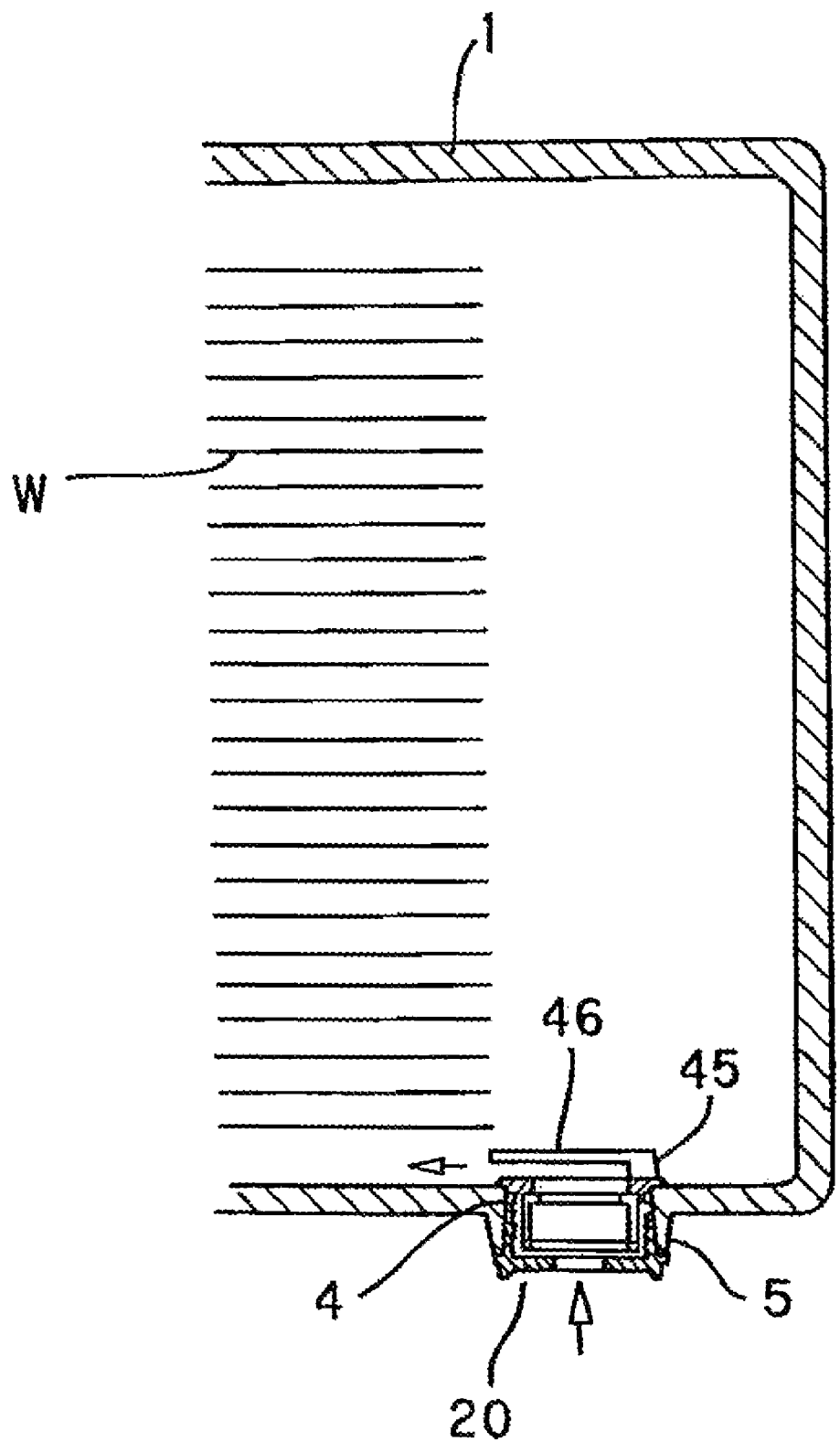
FIG. 20 is a partial sectional illustrative view showing the fifth embodiment of a substrate storage container according to the present invention.

Next, FIG. 20 shows the fifth embodiment of the present invention. In this case, a deflecting plate 45 is provided to stand near any of through-holes 4 in a container body 1, and an elongated part 46 of this deflecting plate 45 is made to oppose valve unit 20 with a gap therebetween.

Deflecting plate 45 is basically formed so as to have an approximately, inverted L-shaped section, using a predetermined resin such as, for example, polycarbonate, polyetherimide, polyetherketone, cycloolefin polymer and the like, and functions to guide gas flow from the valve unit 20 toward semiconductor wafers W or guide the gas in the substrate storage container to the valve unit 20. Other components are the same as that of the above embodiment so the description is omitted.

Also in this embodiment, the same operation and effect as that in the above embodiment can be expected. Besides, since deflecting plate 45 regulates gas flow, obviously it is possible to effectively prevent gas from rushing onto the semiconductor wafer W held at the lowermost stage and blowing particles over it, or flinging up particles.

Figure 21:
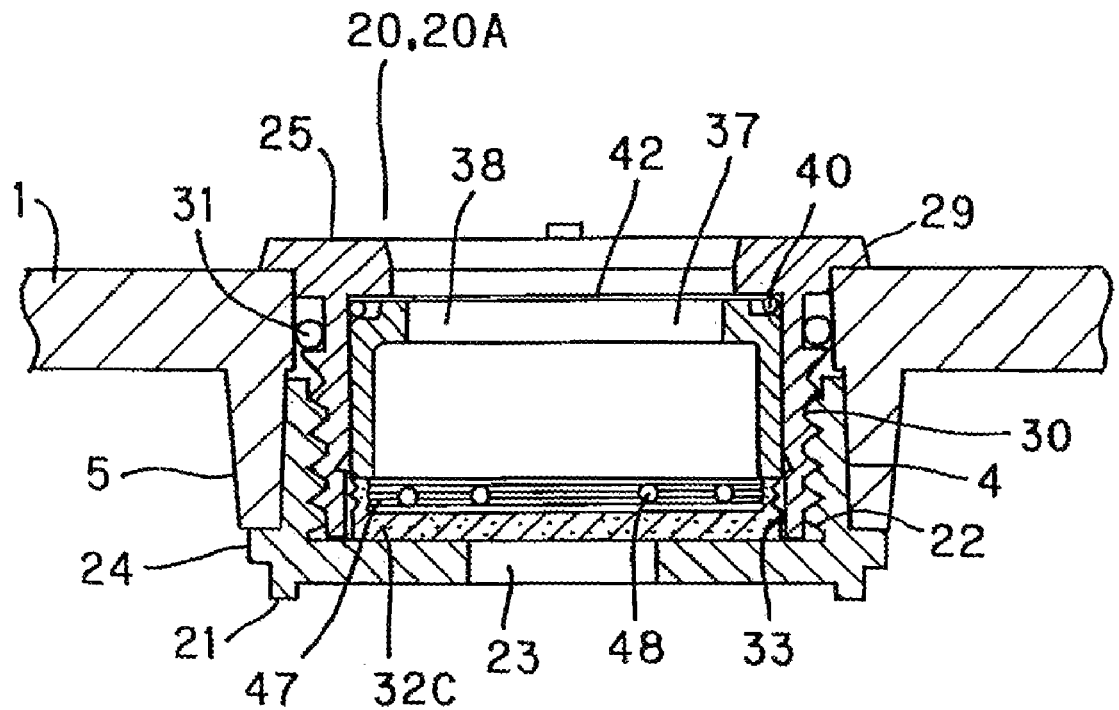
FIG. 21 is a sectional illustrative view showing a gas inlet valve in the sixth embodiment of a substrate storage container according to the present invention.
Figure 22:
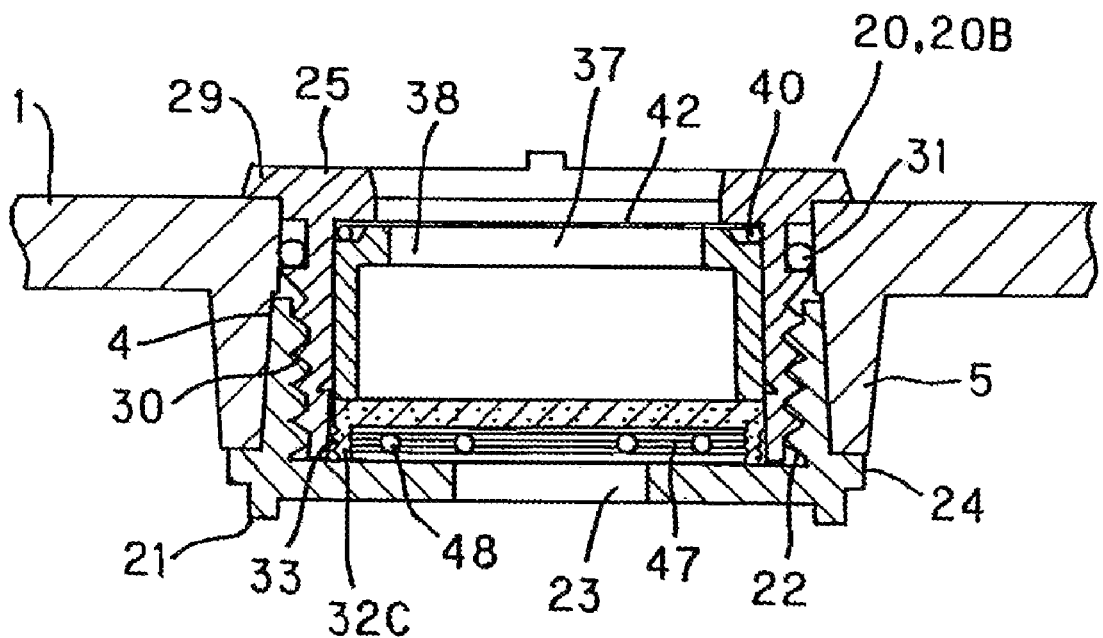
FIG. 22 is a sectional illustrative view showing a gas discharge valve in the sixth embodiment of a substrate storage container according to the present invention.

Next, FIGS. 21 and 22 show the sixth embodiment of the present invention. In this case, the elastic check valve for each valve unit 20 is formed of an elastic check valve 32C having an approximately U-shaped section and fitted to a holding sleeve 25 at least leaving a clearance 33 as a flow passage, and an extensible bellows 47 fitted in the check valve 32C in the form of a cylinder with a base, for deforming check valve 32C, with elastically deformable element 36A omitted.

Bellows 47 is formed in a hollow cylindrical form having flexibility and elasticity, having a multiple number of vent holes 48 for ventilation formed at intervals of a predetermined distance on its peripheral wall. This bellows is laminated to check valve 32C which is located between a fixed sleeve 21 and the bottom of the peripheral wall of an interior lid sleeve 37. This bellows 47 is arranged at either the top or bottom with respect to check valve 32C, depending on whether the valve unit 20 is used as a gas inlet valve 20A or a gas discharge valve 20B. Other components are the same as in the above embodiment so that description is omitted.

In the above configuration, when the valve unit 20 is used as a gas inlet valve 20A and no gas such as an inert gas or the like is fed from the outside into the substrate storage container interior, bellows 47 of gas inlet valve 20A presses check valve 32C against the interior bottom face of fixed sleeve 21 so as to close a vent port 23, creating a sealed state. Accordingly, it is possible to efficiently prevent gas from flowing into the substrate storage container from the outside thereof and from leaking outside from the interior of the substrate storage container.

On the other hand, when the valve unit 20 is used as a gas discharge valve 20B, bellows 47 presses check valve 32C located above, against the opening bottom of interior lid sleeve 37, thus creating a sealed state. Accordingly, it is possible to efficiently prevent gas from flowing into the substrate storage container from the outside thereof and from leaking outside from the interior of the substrate storage container.

Also in this embodiment, the same operation and effect as that in the above embodiment can be expected. Besides, since, instead of being formed of a multiple number of separate parts, the elastic check valve is formed of a check valve 32C for allowing gas to flow when deformed and a bellows 47 providing a spring function, it is expected to reduce the number of parts, hence it is possible to achieve a simple configuration with improved assembly performance and simplified product management.

Figure 23:
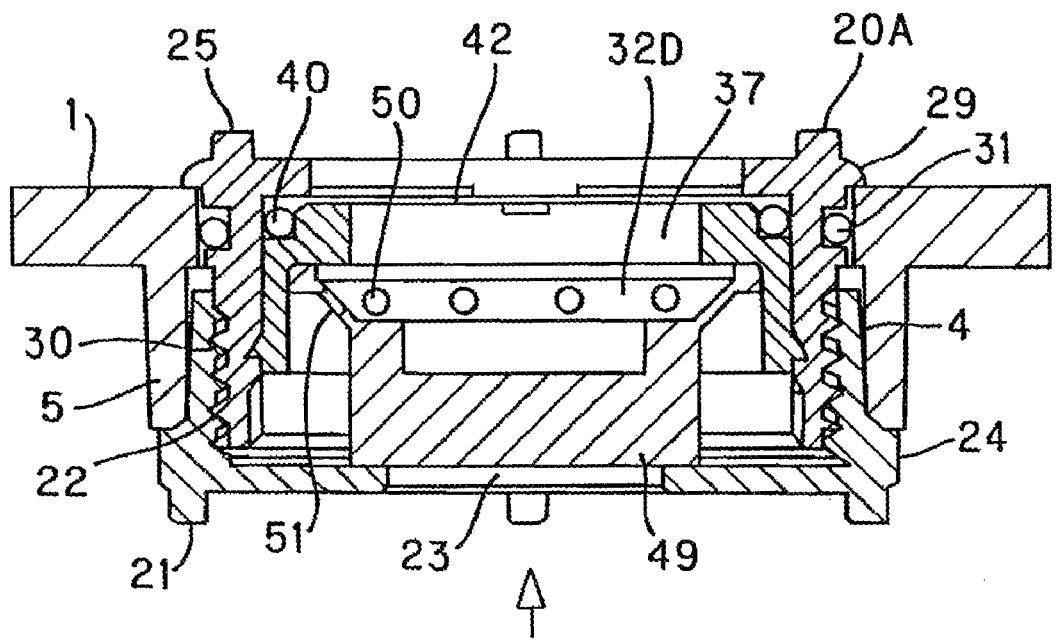
FIG. 23 is a sectional illustrative view showing a gas discharge valve in the seventh embodiment of a substrate storage container according to the present invention.
Figure 24:
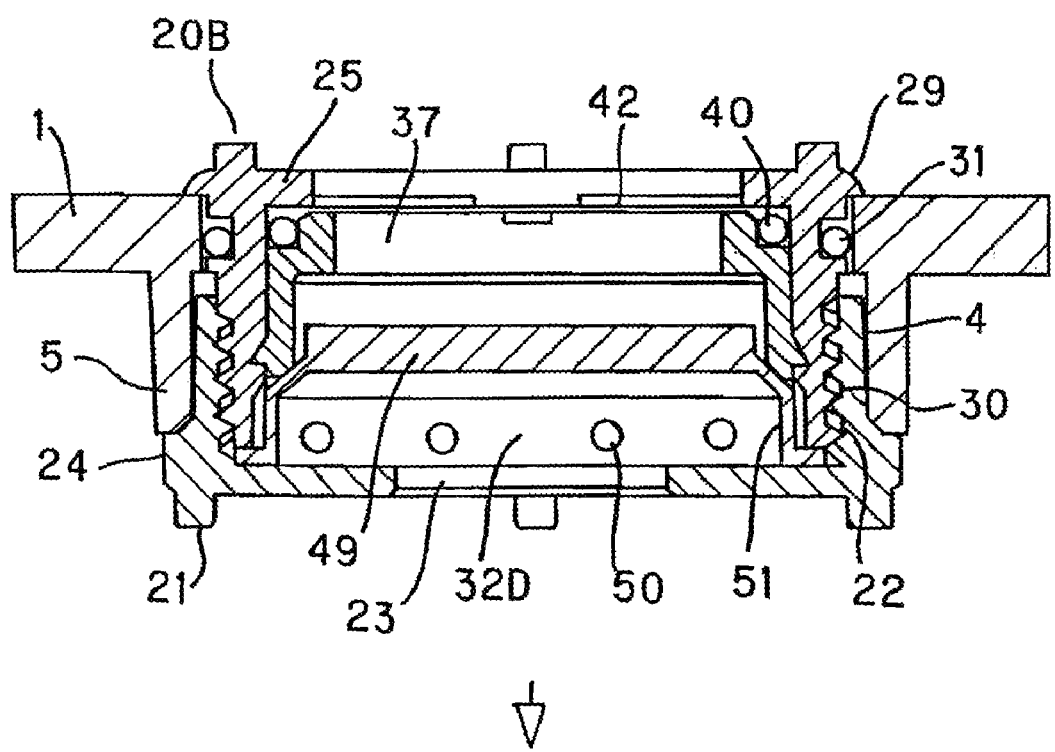
FIG. 24 is a sectional illustrative view showing a gas inlet valve in the seventh embodiment of a substrate storage container according to the present invention.

Next, FIGS. 23 and 24 show the seventh embodiment of the present invention. In this case, the elastic check valve for each valve unit 20 is formed of an elastic check valve 32D fitted to a holding sleeve 25, leaving a clearance 33 for the flow passage and an elastic skirt body 49 for check valve 32D, which is integrated with check valve 32D with a gap in between, with elastically deformable element 36A omitted.

For the material of check valve 32C and skirt body 49, rubbers including melamine rubber, isoprene rubber, butyl rubber, silicone rubber and fluororubber, polyester thermoplastic elastomer and other thermoplastic elastomers can be used. Formed in check valve 32D are a multiple number of passage holes 50 for ventilation at intervals of a predetermined distance.

The skirt body 49 is formed in a disk-like form or a cylindrical form having an approximate concave-top section. A thin elastic skirt piece 51 is flexibly extended from the rim of the skirt body, has a hollow, approximately frustoconical shape, and is fitted on the periphery of check valve 32D and integrated with it. This skirt body 49 is arranged at either the top or bottom with respect to check valve 32D, depending on whether the valve unit 20 is used as a gas inlet valve 20A or a gas discharge valve 20B. Other components are the same as in the above embodiment so that description is omitted.

In the above configuration, when the valve unit 20 is used as a gas inlet valve 20A and no gas such as an inert gas or the like is fed from the outside into the substrate storage container interior, skirt body 49 of gas inlet valve 20A, presses check valve 32D located below by skirt piece 51, against the interior bottom face of fixed sleeve 21 so as to close a vent port 23, creating a sealed state. Accordingly, it is possible to efficiently prevent gas from flowing into the substrate storage container from the outside thereof and, from leaking outside from the interior of the substrate storage container.

On the other hand, when the valve unit 20 is used as a gas discharge valve 20B, skirt body 49 located below presses check valve 32D located above, by skirt piece 51, against the opening bottom of an interior lid sleeve 37, thus creating a sealed state. Accordingly, it is possible to efficiently prevent gas from flowing into the substrate storage container from the outside thereof and from leaking outside from the interior of the substrate storage container.

Also in this embodiment, the same operation and effect as that in the above embodiment can be expected. Besides, since the elastic check valve is formed of a check valve 32D for allowing gas to flow when deformed and a skirt body 49 providing a spring function, it is expected to reduce the number of parts, hence it is possible to achieve a simple configuration with improved assembly performance and simplified product management.

In the above, though engagement slots 8 are formed on the interior peripheral surface of rim portion 7 of container body 1, these can be omitted. In this case, the interlocking mechanism for door 10 which operates by external control can be omitted. Further, with some modification of the shape of the check valve 32 shown in FIGS. 10 and 11, usage mode can be switched by changing the attachment position of elastically deformable element 36 without inverting the check valve 32 itself. It is also possible to provide some projections for valve opening and closing, suctioning hands and other components for the processing equipment for gas feed and discharge.

Next, an example of a substrate storage container of the present invention will be explained with a comparative example.

Using a substrate storage container having the valve units shown in FIGS. 4 and 6, the oxygen concentration was measured when the interior of the substrate storage container was replaced by nitrogen gas while the retention time the low-oxygen state could be maintained was measured.

From the measurement results, the system of this example, using nitrogen gas at a flow rate of 20 L/min, could reach levels of 10 ppm oxygen concentration or lower in about 15 minutes. In the examination of the change of the oxygen concentration when the substrate storage container was left without any supply of nitrogen gas, it took about five hours until the oxygen concentration increased up to 1%.

Thereby, it was confirmed that the low-oxygen state can be maintained for a fixed period when the semiconductor wafers need to be temporarily stored in the course of processing, whereby it is possible to inhibit contamination and surface oxidation of semiconductor wafers.

In contrast to this, using a substrate storage container having the conventional valve units, the retention time the low-oxygen state could be maintained in the substrate storage container was measured.

Upon measurement, a pair of through-holes were formed in the bottom of the container body, and a piping route for measurement was prepared so as to connect these through-holes. An oximeter was interposed in this piping route so that the oxygen concentration was measured every one minute. The formed pair of through-holes were sealed at their periphery, and nitrogen gas was fed at a fixed rate into the substrate storage container via an inlet valve. The oximeter used was of a product of Toray Engineering Co., Ltd., having a measurement rage 0.1 ppm to 100 VOL %.

From the measurement result, change of the oxygen concentration after the substrate storage container was left without any supply of nitrogen gas was examined, and it was found that the oxygen concentration increased to 1% after only 70 minutes or thereabouts.

INDUSTRIAL APPLICABILITY

The present invention is able to simplify the engagement structure for valve attachment, and provides a configuration that will not allow displacement of the valves even with repeated use. It is also possible to prevent sealing leakage, and hence inhibit the risk of a trace amount of discharged metal ions contaminating the substrates. Further, it is possible to maintain the purging gas for a relatively long period, and prevent contaminants from infiltrating into the container from outside.

The invention claimed is:

1. A substrate storage container including:
   a container body;
   a door for opening and closing the container body;
   a valve unit attached to a through-hole formed in the container body for regulating the gas flow with respect to the container body, characterized in that the valve unit comprises:
   a fixed sleeve for gas flow, fitted in the through-hole;
   a holding sleeve for gas flow, threadably mated with the fixed sleeve;
   an elastic check valve built in between the fixed sleeve and the holding sleeve,
   wherein the elastic check valve is actuated by gas pressure; and
   an interior lid sleeve for gas flow, opposing the elastic check valve, and one of the fixed sleeve and the interior lid sleeve is adapted to be opened and closed by the elastic check valve, so that gas will pass through when the elastic check valve is open while gas will be prevented from passing when the elastic check valve is closed; and
   a hollow nozzle tower communicating with the valve unit is made to stand, the peripheral wall thereof being formed with gas ejection holes,
   wherein a rib is formed and extended outward from the periphery of the through-hole and the fixed sleeve is formed with a flange that is in contact with the periphery of the rib while the holding sleeve is formed with a flange that is in contact with the periphery of the through-hole.

2. The substrate storage container according to claim 1, wherein the valve unit as a gas inlet valve or gas discharge valve is fitted to the through-hole.

3. The substrate storage container according to claim 1, wherein a clearance for gas flow is formed at least between the holding sleeve and the periphery of the elastic check valve.

4. The substrate storage container according to claim 1, wherein the interior lid sleeve is fitted in the holding sleeve with an air filter interposed therebetween.

5. The substrate storage container according to claim 1, wherein the elastic check valve is at least made up of a check valve that is built in the fixed sleeve, leaving a clearance, and an elastically deformable element interposed between the check valve and the interior lid sleeve, and the opening of the fixed sleeve is adapted to be opened and closed by the check valve, so that gas will pass through when the check valve is open while gas will be prevented from passing when the check valve is closed.

6. The substrate storage container according to claim 1, wherein the elastic check valve is at least made up of a check valve that is built in the fixed sleeve, leaving a clearance, and an elastically deformable element interposed between the check valve and the fixed sleeve, and the opening of the interior lid sleeve is adapted to be opened and closed by the check valve, so that gas will pass through when the check valve is open while gas will be prevented from passing when the check valve is closed.

7. The substrate storage container according to claim 1, wherein the elastic check valve is at least made up of a check valve that is built in the fixed sleeve, leaving a clearance, and an elastically deformable element for the check valve, and either the check valve or the elastically deformable element is made in contact with the interior lid sleeve, so that gas will pass through when the check valve is open while gas will be prevented from passing when the check valve is closed.

8. The substrate storage container according to claim 5, wherein a guide element is provided for either the check valve of the elastic check valve or the interior lid sleeve while a guided part is provided for the other, so that the guide element and the guided part fit to each other in a slidably manner.

9. The substrate storage container according to claim 8, wherein the guide element is formed in the interior lid sleeve so as to have an approximately convex-top section while the guided part is formed in the check valve of the elastic check valve so as to have an approximately concave-top section.

10. The substrate storage container according to claim 5, wherein a sealing element is attached to the check valve of the elastic check valve, and the sealing element is placed into deforming contact with the opening of the fixed sleeve or the interior lid sleeve to seal.

11. The substrate storage container according to claim 1, wherein the elastic check valve is at least made up of a check valve that is built in the fixed sleeve, leaving a clearance and an extensible bellows fitted in the check valve, the peripheral wall of the bellows is formed with a passage opening, and the check valve can be opened and closed by the extension and compression of the bellows.

12. The substrate storage container according to claim 1, wherein the elastic check valve is at least made up of a check valve that is built in the fixed sleeve, leaving a clearance and an elastic skirt body integrated with the check valve, a passage opening is formed in the check valve, an approximately cylindrical skirt piece is flexibly extended from the rim of the skirt body and is fitted on the periphery of the check valve, and the check valve can be opened and closed by the deformation of the skirt body.

* * * * *